US011476827B2

(12) United States Patent
Bhattacharjee

(10) Patent No.: US 11,476,827 B2
(45) Date of Patent: Oct. 18, 2022

(54) MULTI-FREQUENCY GUIDED WAVE DEVICES AND FABRICATION METHODS

(71) Applicant: Qorvo US, Inc., Greensboro, NC (US)

(72) Inventor: Kushal Bhattacharjee, Kernersville, NC (US)

(73) Assignee: Qorvo US, Inc., Greensboro, NC (US)

( * ) Notice: Subject to any disclaimer, the term of this patent is extended or adjusted under 35 U.S.C. 154(b) by 660 days.

(21) Appl. No.: 16/505,775

(22) Filed: Jul. 9, 2019

(65) Prior Publication Data

US 2019/0341904 A1 Nov. 7, 2019

Related U.S. Application Data

(60) Division of application No. 14/972,929, filed on Dec. 17, 2015, now Pat. No. 10,348,269, which is a
(Continued)

(51) Int. Cl.
*H03H 9/02* (2006.01)
*H01L 41/047* (2006.01)
(Continued)

(52) U.S. Cl.
CPC ....... *H03H 9/02244* (2013.01); *H01L 41/047* (2013.01); *H01L 41/312* (2013.01);
(Continued)

(58) Field of Classification Search
CPC .. H03H 9/02244; H03H 3/02; H03H 9/02228; H03H 9/02275; H03H 9/02574;
(Continued)

(56) References Cited

U.S. PATENT DOCUMENTS 5,565,725 A  10/1996 Nakahata et al.
7,262,676 B2  8/2007 Ruile et al.
(Continued)

FOREIGN PATENT DOCUMENTS

CN  101034880 A  9/2007
CN  102089970 A  6/2011
(Continued)

OTHER PUBLICATIONS

Received STIC search report from EIC 2800 searcher Steve Chung, Chickasaw for claim 1 on Mar. 30, 2022. (Year: 2022).*
(Continued)

*Primary Examiner* — Shawki S Ismail
*Assistant Examiner* — Htet Z Kyaw
(74) *Attorney, Agent, or Firm* — Withrow & Terranova, P.L.L.C.

(57) ABSTRACT

A micro-electrical-mechanical system (MEMS) guided wave device includes a piezoelectric layer including multiple thinned regions of different thicknesses each bounding in part a different recess, different groups of electrodes on or adjacent to different thinned regions and arranged for transduction of lateral acoustic waves of different wavelengths in the different thinned regions, and at least one bonded interface between the piezoelectric layer and a substrate. Optionally, a buffer layer may be intermediately bonded between the piezoelectric layer and the substrate. Methods of producing such devices include locally thinning a piezoelectric layer to define multiple recesses, bonding the piezoelectric layer on or over a substrate layer to cause the recesses to be bounded in part by either the substrate or an optional buffer layer, and defining multiple groups of electrodes on or over the different thinned regions.

16 Claims, 21 Drawing Sheets

Related U.S. Application Data continuation of application No. PCT/US2015/066300, filed on Dec. 17, 2015.

(60) Provisional application No. 62/093,753, filed on Dec. 18, 2014, provisional application No. 62/093,184, filed on Dec. 17, 2014.

(51) Int. Cl.
*H01L 41/312* (2013.01)
*H01L 41/33* (2013.01)
*H03H 3/02* (2006.01)
*H03H 9/25* (2006.01)

(52) U.S. Cl.
CPC ............... *H01L 41/33* (2013.01); *H03H 3/02* (2013.01); *H03H 9/02228* (2013.01); *H03H 9/02275* (2013.01); *H03H 9/02574* (2013.01); *H03H 9/25* (2013.01); *H03H 2003/027* (2013.01)

(58) Field of Classification Search
CPC ............... H03H 9/25; H03H 2003/027; H03H 2003/0435; H03H 2003/0421; H01L 41/047; H01L 41/312; H01L 41/33
See application file for complete search history.

(56) References Cited

U.S. PATENT DOCUMENTS

| | | | |
|---|---|---|---|
| 7,528,685 B2 * | 5/2009 | Tanaka | H03H 9/02228 333/195 |
| 7,586,239 B1 | 9/2009 | Li et al. | |
| 7,619,347 B1 | 11/2009 | Bhattacharjee | |
| 7,812,692 B2 | 10/2010 | Ayazi et al. | |
| 7,854,049 B2 | 12/2010 | Yoshino et al. | |
| 7,898,158 B1 | 3/2011 | Li et al. | |
| 7,965,015 B2 | 6/2011 | Tai et al. | |
| 8,035,280 B2 | 10/2011 | Li et al. | |
| 8,278,802 B1 | 10/2012 | Lee et al. | |
| 8,490,260 B1 | 7/2013 | Zhgoon et al. | |
| 8,692,630 B2 | 4/2014 | Reinhardt et al. | |
| 9,059,677 B2 | 6/2015 | Reinhardt et al. | |
| 9,117,593 B2 | 8/2015 | Bhattacharjee | |
| 2003/0199105 A1 | 10/2003 | Kub et al. | |
| 2007/0188047 A1 * | 8/2007 | Tanaka | H03H 9/02228 310/313 D |
| 2008/0266024 A1 | 10/2008 | Ruile et al. | |
| 2008/0297281 A1 | 12/2008 | Ayazi et al. | |
| 2010/0327995 A1 | 12/2010 | Reinhardt et al. | |
| 2011/0109196 A1 | 5/2011 | Goto et al. | |
| 2011/0266918 A1 * | 11/2011 | Iwamoto | H03H 9/059 29/25.35 |
| 2012/0198672 A1 * | 8/2012 | Ueda | H03H 3/02 29/25.35 |
| 2014/0009032 A1 * | 1/2014 | Takahashi | H03H 9/02228 29/25.35 |
| 2014/0152146 A1 | 6/2014 | Kimura et al. | |
| 2014/0210314 A1 | 7/2014 | Bhattacharjee et al. | |
| 2015/0288345 A1 | 10/2015 | Bhattacharjee | |
| 2016/0182007 A1 | 6/2016 | Bhattacharjee | |
| 2016/0182008 A1 | 6/2016 | Bhattacharjee | |
| 2016/0182009 A1 | 6/2016 | Bhattacharjee | |

FOREIGN PATENT DOCUMENTS

| | | |
|---|---|---|
| CN | 103283147 A | 9/2013 |
| EP | 1821406 A2 | 8/2007 |
| EP | 2658122 A1 | 10/2013 |
| JP | S5664509 A | 6/1981 |
| JP | H5304436 A | 11/1993 |
| JP | 2004187204 A | 7/2004 |
| JP | 2005223610 A | 8/2005 |
| WO | 2008089002 A1 | 7/2008 |
| WO | 2010004741 A1 | 1/2010 |
| WO | 2010077313 A1 | 7/2010 |
| WO | 2012086441 A1 | 6/2012 |

OTHER PUBLICATIONS

Received STIC search report from EIC 2800 searcher Emily P Huston for claims 13 and 14 on Apr. 4, 2022. (Year: 2022).*
First Office Action for Chinese Patent Application No. 201580076411.1, dated Feb. 3, 2020, 24 pages.
Notice of Reasons for Refusal for Japanese Patent Application No. 2017-551574, dated Jan. 14, 2020, 13 pages.
Notice of Reasons for Rejection for Japanese Patent Application No. 2020195259, dated Oct. 5, 2021, 6 pages.
Baron, Thomas et al., "Wideband Lithium Niobate FBAR Filters," International Journal of Microwave Science and Technology, vol. 2013, 2013, 6 pages.
Bhattacharjee, K. et al., "Cavityless Wafer Level Packaging of SAW Devices," 2007 IEEE Ultrasonics Symposium, Oct. 28-31, 2007, New York, NY, IEEE, pp. 1886-1889.
Ferrari, Vittorio et al., "Overview of Acoustic-Wave Microsensors," Piezoelectric Transducers and Applications, Springer-Verlag Berlin Heidelberg, 2008, pp. 39-62.
Gong, Songbin et al., "Monolithic Multi-Frequency Wideband RF Filters Using Two-Port Laterally Vibrating Lithium Niobate MEMS Resonators," Journal of Microelectromechanical Systems, vol. 23, No. 5, Oct. 2014, pp. 1188-1197.
Kadota, Michio et al., "Simulation of solidly mounted plate wave resonator with wide bandwidth using 0-th shear horizontal mode in $LiNbO_3$ plate," Japanese Journal of Applied Physics, vol. 54, Jun. 15, 2015, 4 pages.
Koné, I. et al., "Guided acoustic wave resonators using an acoustic Bragg mirror," Applied Physics Letters, vol. 96, No. 223504, Jun. 3, 2010, 3 pages.
Lebrasseur, E. et al., "Design and fabrication of an acoustic bragg mirror for miniaturized quartz resonators," Proceedings of the Acoustics 2012 Nantes Conference, Apr. 23-27, 2012, Nantes, France, pp. 3361-3366.
Lin, Chih-Ming et al., "Two-Port Filters and Resonators on ALN/3C-SIC Plates Utilizing High-Order Lamb Wave Modes," 2013 IEEE International Conference on Micro Electro Mechanical Systems (MEMS), Jan. 20-24, 2013, Taipei, Taiwan, IEEE, pp. 789-792.
Nakahata, H. et al., "SAW resonators of $SiO_2$/ZnO/diamond structure in GHz range," Proceedings of the 2000 IEEE/EIA International Frequency Control Symposium and Exhibition, 2000, IEEE, pp. 315-320.
Olsson III, R.H. et al., "Lamb Wave Micromechanical Resonators Formed in Thin Plates of Lithium Niobate," Solid-State Sensors, Actuators and Microsystems Workshop, Jun. 8-12, 2014, Hilton Head Island, South Carolina, 4 pages.
Rodríguez-Madrid, J. G. et al., "Super-High-Frequency SAW Resonators on AlN/Diamond," IEEE Electron Device Letters, vol. 33, No. 4, Apr. 2012, pp. 495-497.
Suni, T. et al., "Silicon-on-Insulator Wafers with Buried Cavities," Journal of The Electrochemical Society, vol. 153, No. 4, 2006, pp. G299-G303.
Thakar, Vikram et al., "Monolithic implementation of AlN-on-silicon bandpass filters with a high-Q notch within the passband," IEEE International Frequency Control Symposium, Baltimore, MD, May 2012, IEEE, 5 pages.
Zhou, Changjian et al., "Temperature-Compensated High-Frequency Surface Acoustic Wave Device," IEEE Electron Device Letters, vol. 34, No. 12, Dec. 2013, pp. 1572-1574.
International Search Report and Written Opinion for PCT/US2015/066300, dated Apr. 5, 2016, 18 pages.
Invitation to Pay Additional Fees and Partial International Search Report for PCT/US2015/066424, dated Apr. 1, 2016, 11 pages.
International Preliminary Report on Patentability for International Patent Application No. PCT/US2015/066300, dated Jun. 29, 2017, 13 pages.

(56) References Cited

OTHER PUBLICATIONS

International Search Report and Written Opinion for PCT/US2015/066424, dated Jul. 25, 2016, 34 pages.
International Preliminary Report on Patentability for International Patent Application No. PCT/US2015/066424, dated Jun. 29, 2017, 24 pages.
Ex Parte Quayle Action for U.S. Appl. No. 14/972,929, dated Nov. 1, 2018, 6 pages.
Notice of Allowance for U.S. Appl. No. 14/972,929, dated Feb. 28, 2019, 8 pages.
Corrected Notice of Allowability for U.S. Appl. No. 14/972,929, dated Jun. 7, 2019, 5 pages.
Non-Final Office Action for U.S. Appl. No. 14/973,336, dated Nov. 9, 2018, 7 pages.
Notice of Allowance for U.S. Appl. No. 14/973,336, dated Apr. 3, 2019, 11 pages.
Notice of Allowance for U.S. Appl. No. 14/973,295, dated Mar. 25, 2019, 13 pages.
Non-Final Office Action for U.S. Appl. No. 14/973,295, dated Oct. 5, 2018, 11 pages.
Decision to Grant for Japanese Patent Application No. 2017551574, dated Oct. 27, 2020, 4 pages.
Second Office Action for Chinese Patent Application No. 201580076411.1, dated Jul. 1, 2020, 8 pages.
Notice of Reasons for Refusal for Japanese Patent Application No. 2017-551574, dated Jun. 30, 2020, 5 pages.
Alam, S., "EIC Search Report," U.S. Appl. No. 16/544,279, dated Mar. 31, 2022, Scientific and Technical Information Center, 16 pages.
Cueto, F., "EIC Search Report," U.S. Appl. No. 16/544,279, dated Mar. 30, 2022, Scientific and Technical Information Center, 19 pages.
Notice of Reasons for Rejection for Japanese Patent Application No. 2020195259, dated May 10, 2022, 9 pages.
Non-Final Office Action for U.S. Appl. No. 16/544,279, dated Jul. 15, 2022, 16 pages.

* cited by examiner

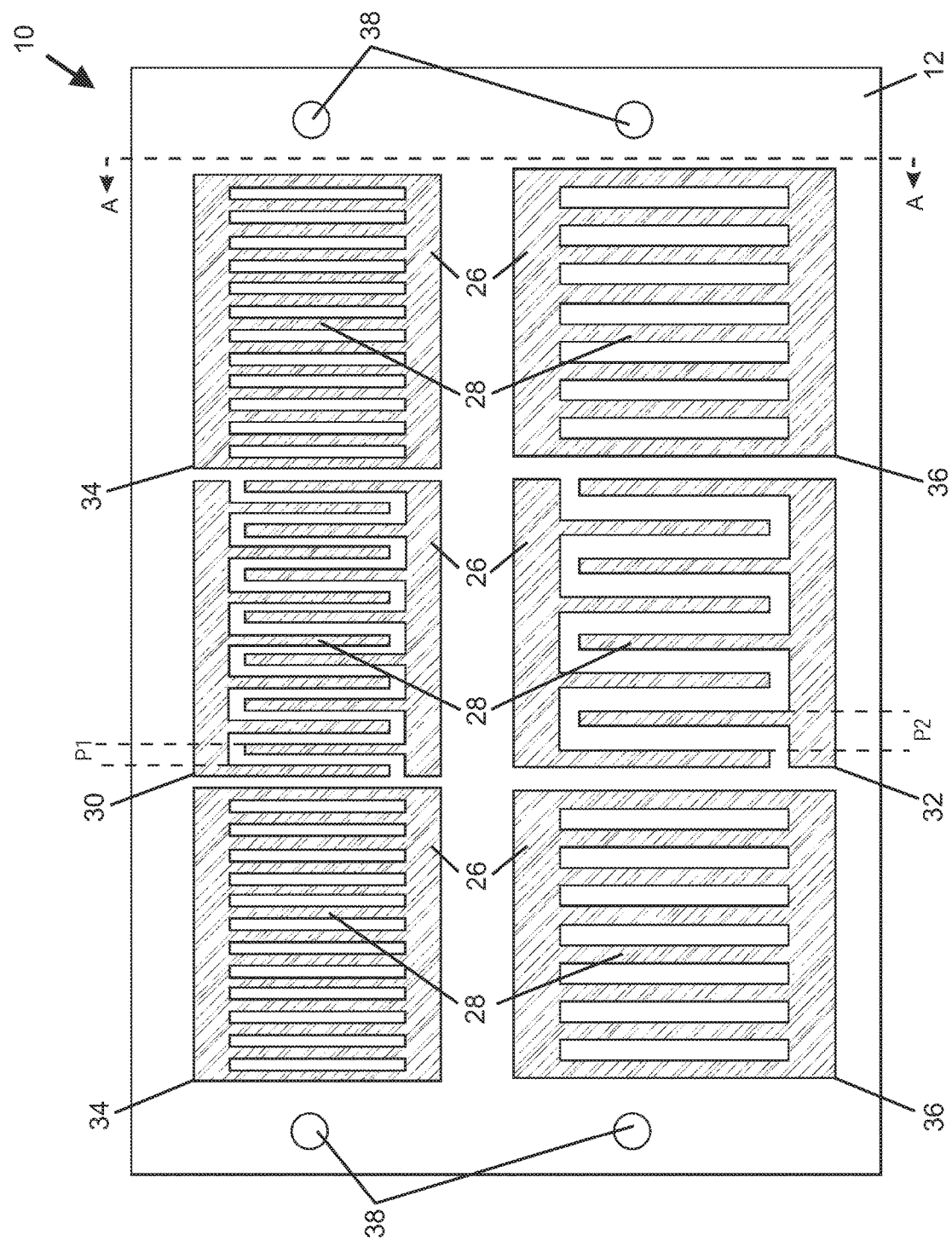
FIG._1A

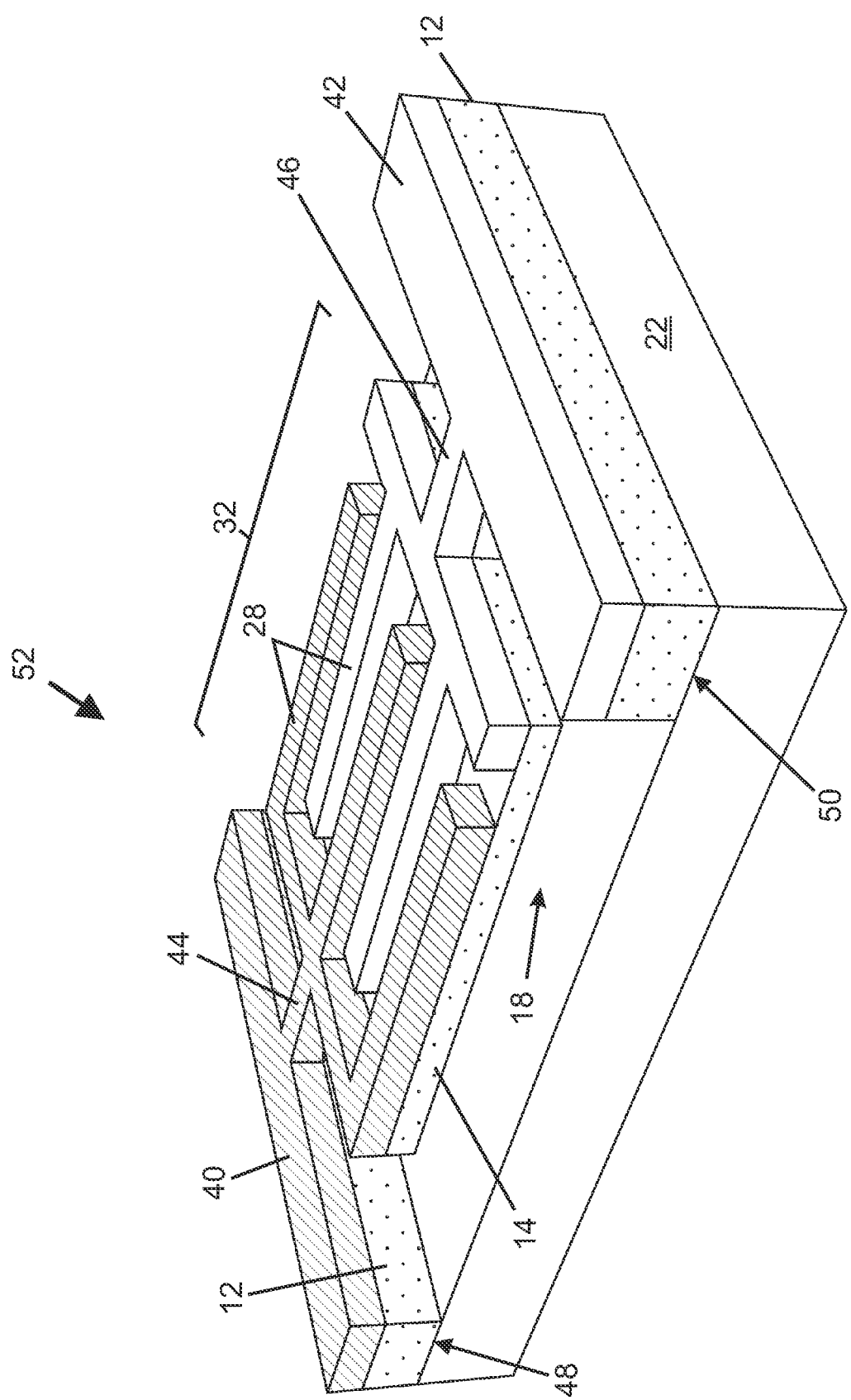
FIG._2

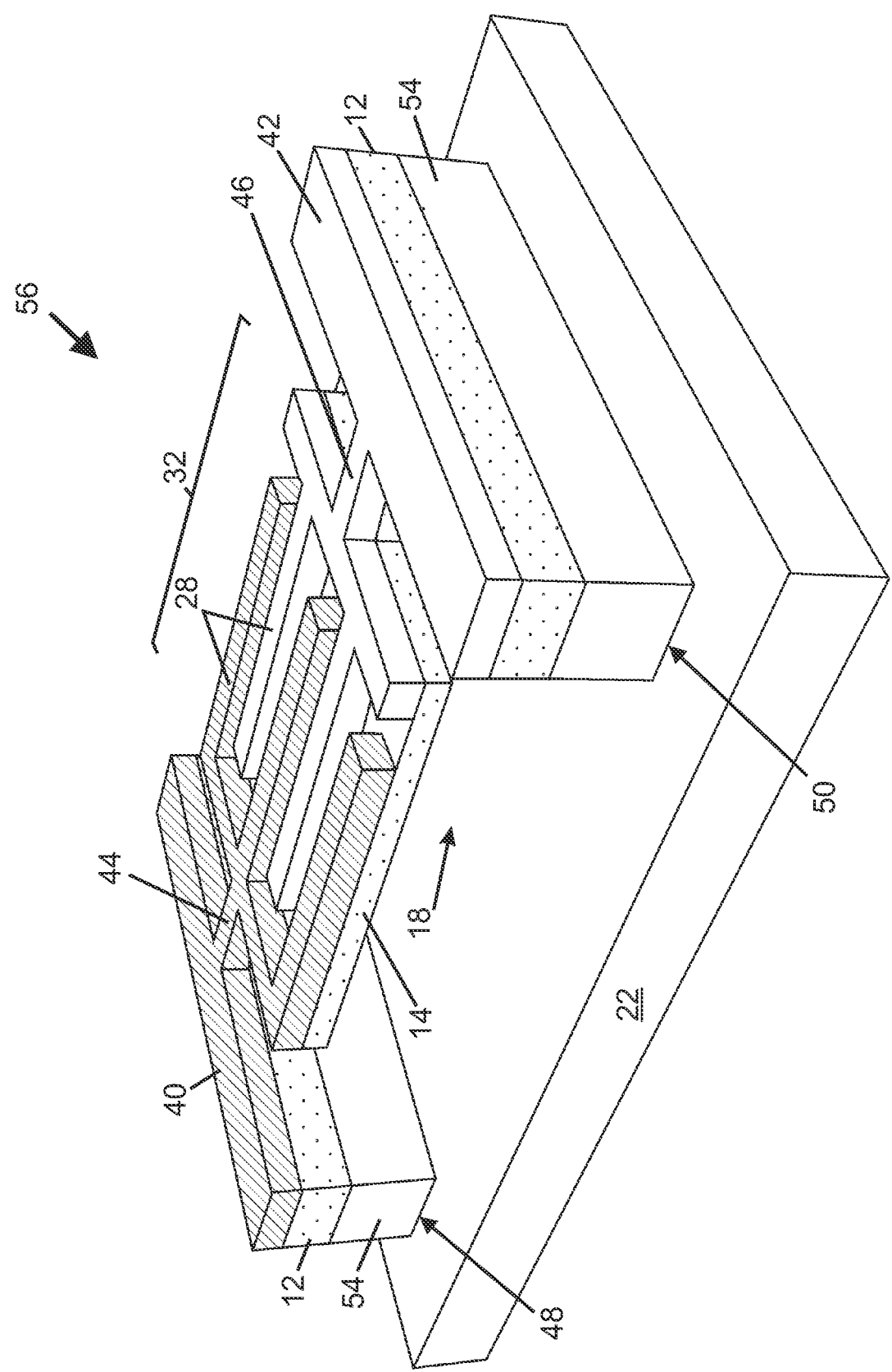
FIG._3

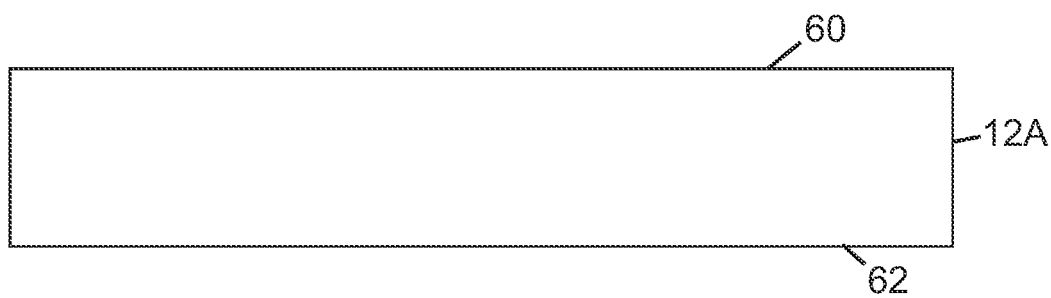
FIG._4A
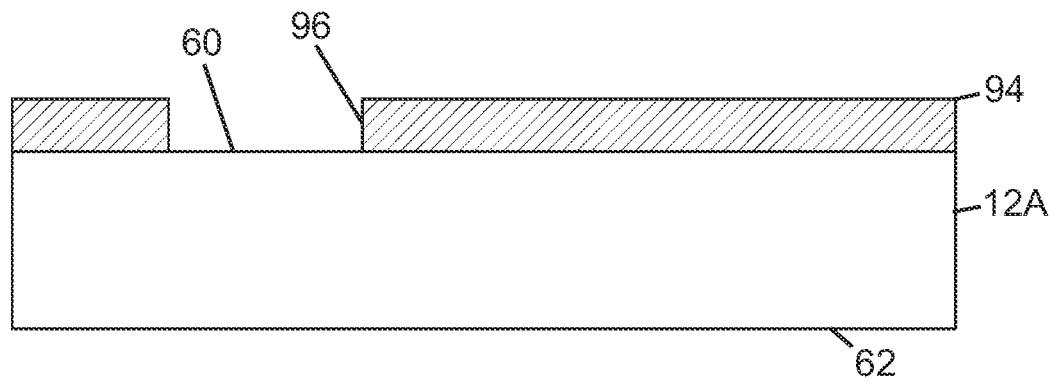
FIG._4B
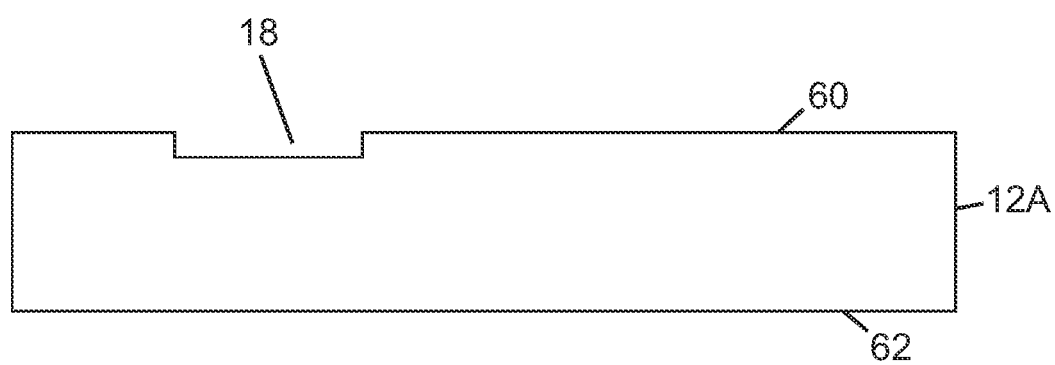
FIG._4C

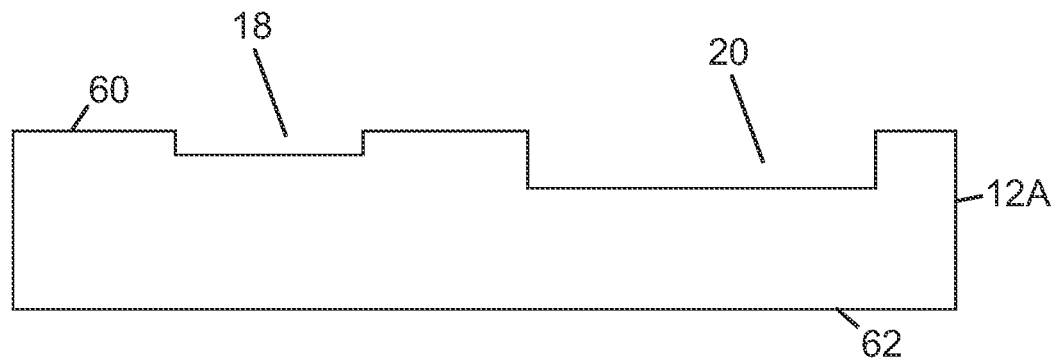
FIG._4D
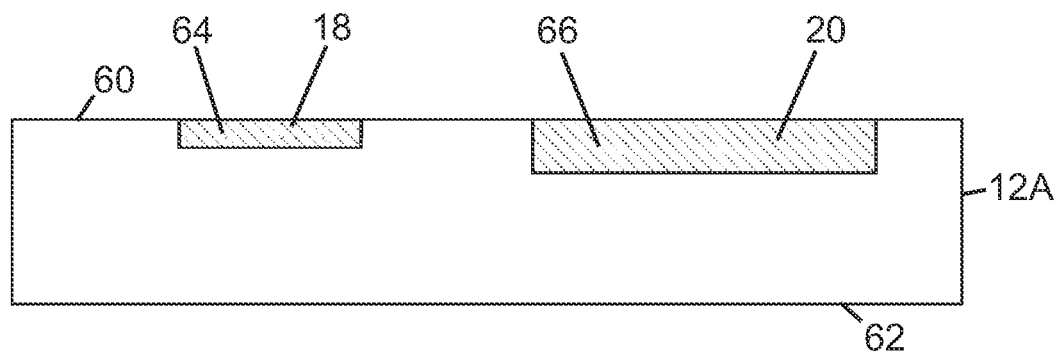
FIG._4E
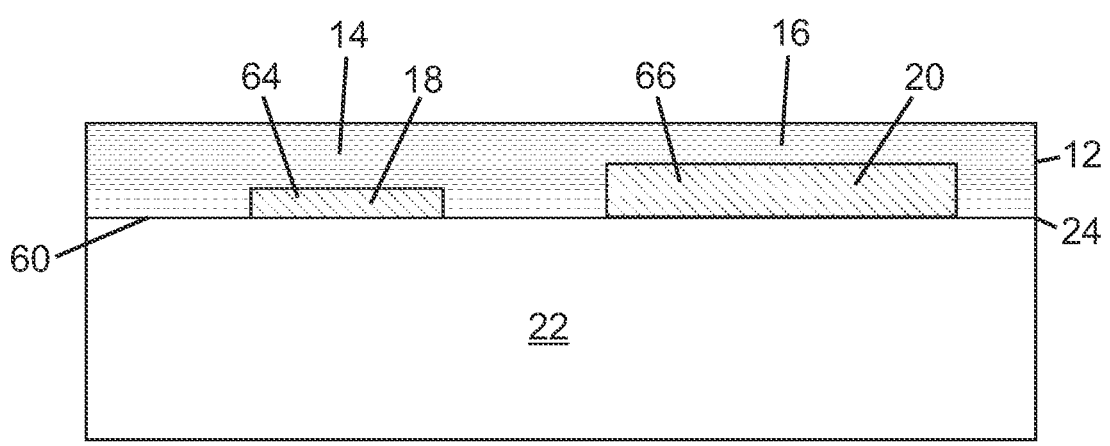
FIG._4F

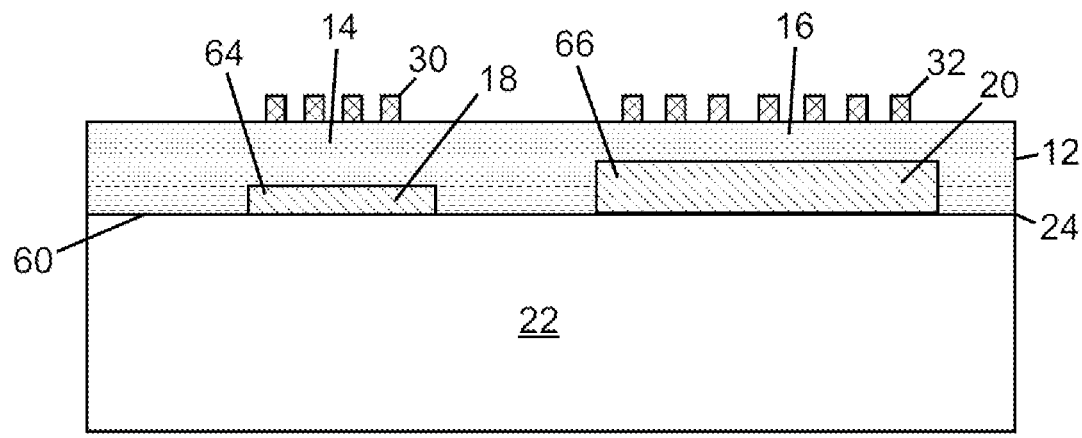
FIG._4G
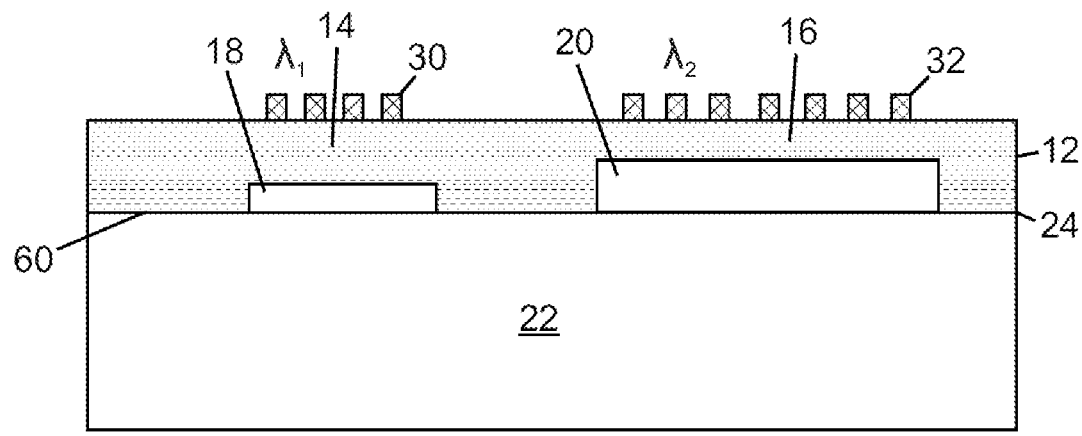
FIG._4H

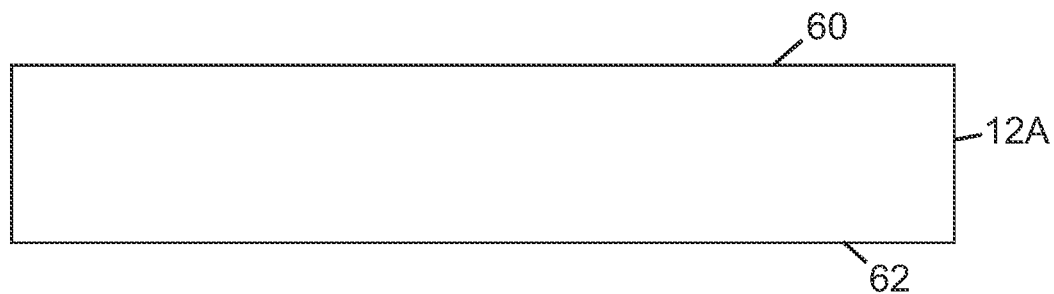
FIG._5A
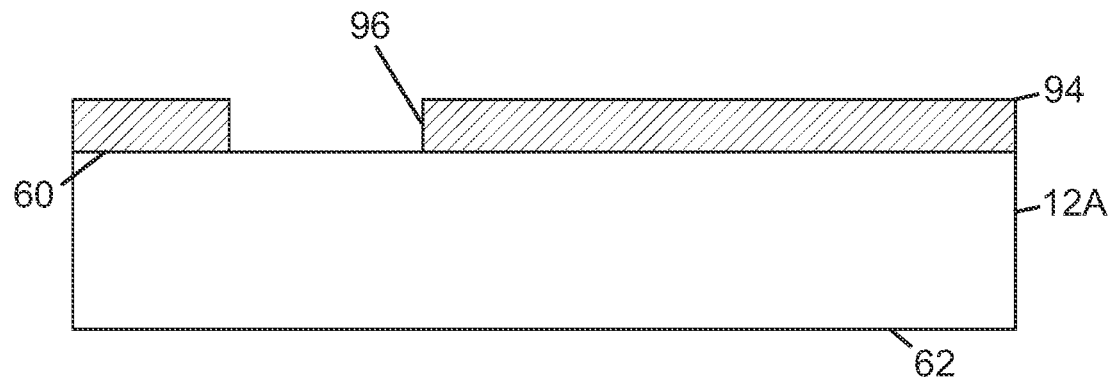
FIG._5B
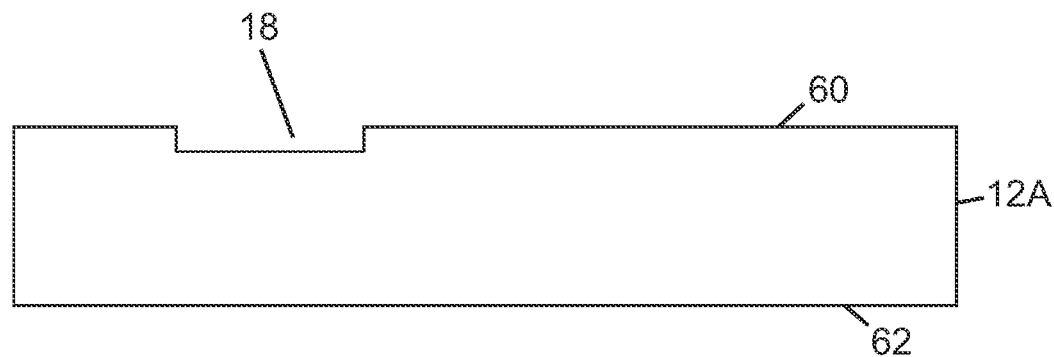
FIG._5C

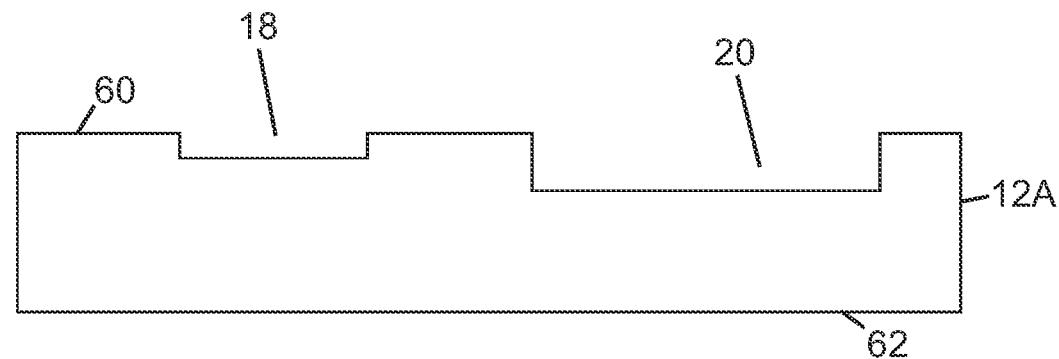
FIG._5D
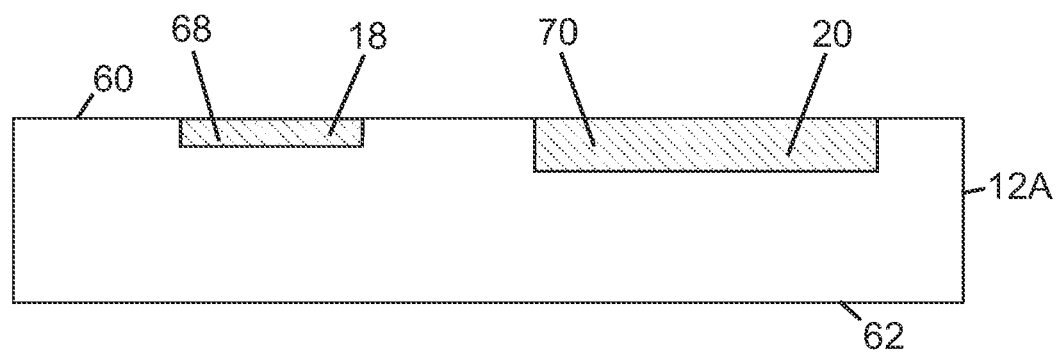
FIG._5E
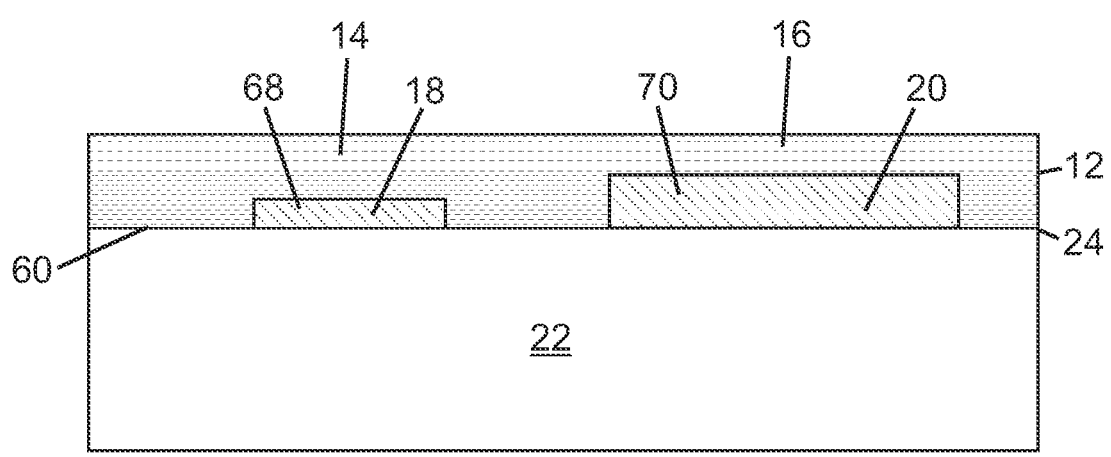
FIG._5F

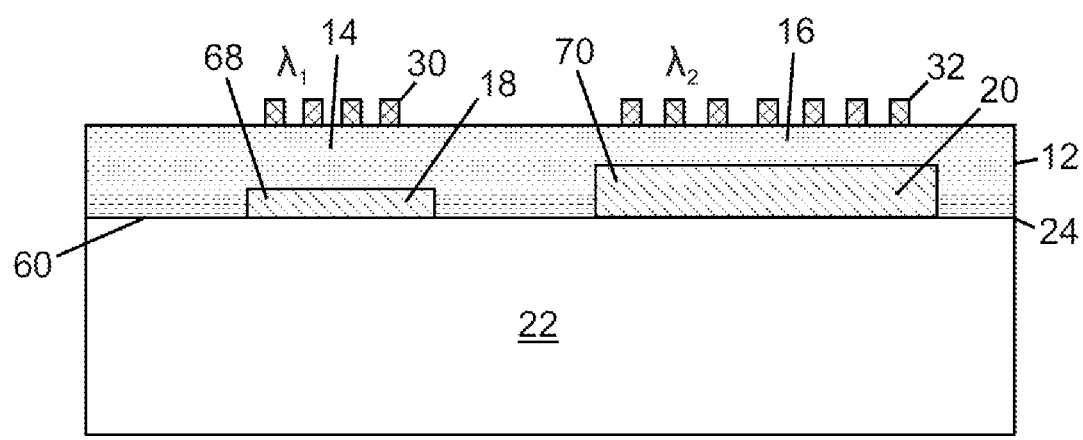
FIG. _5G

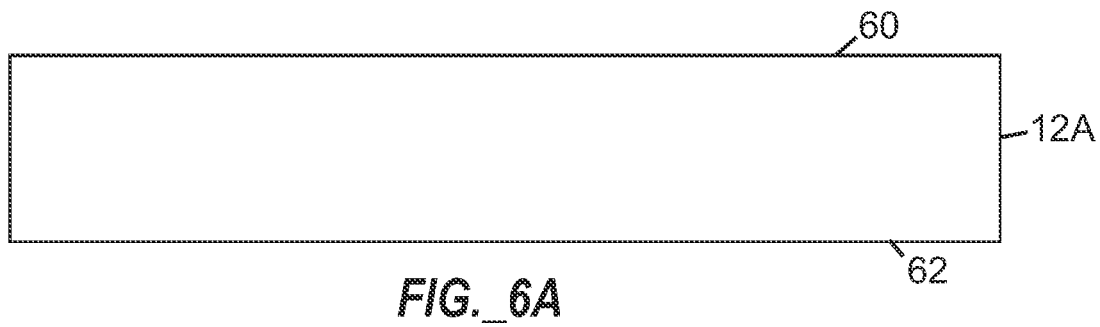
FIG. _6A
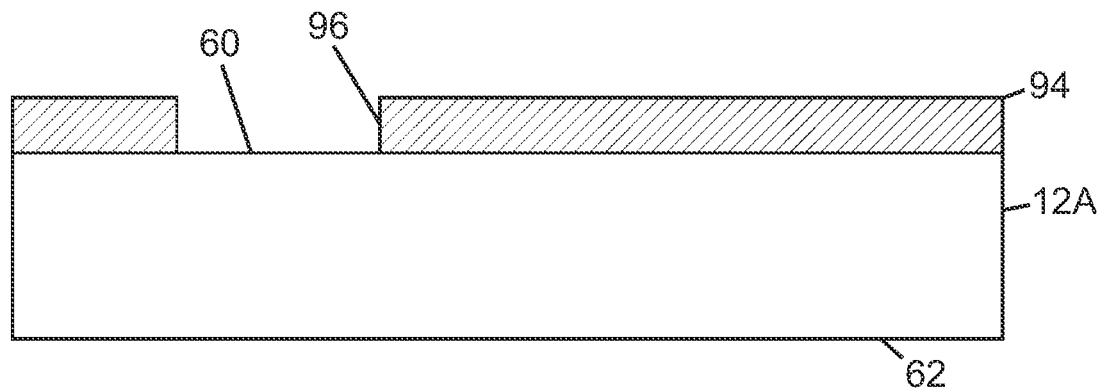
FIG. _6B
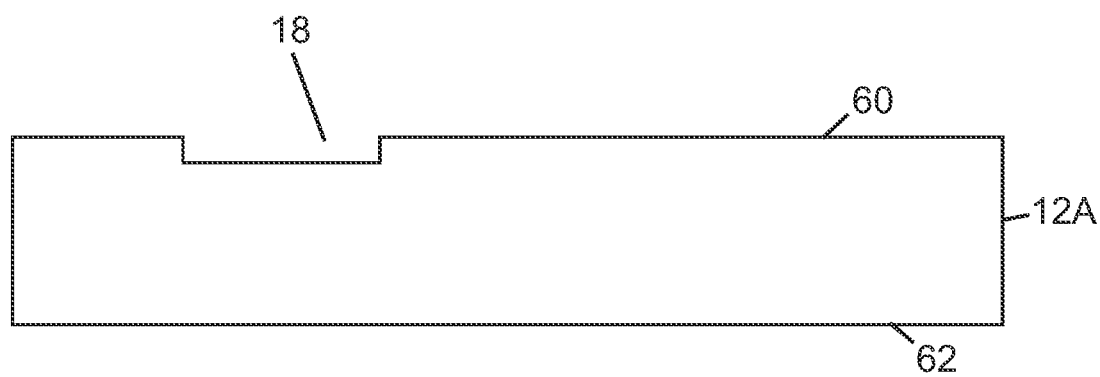
FIG. _6C

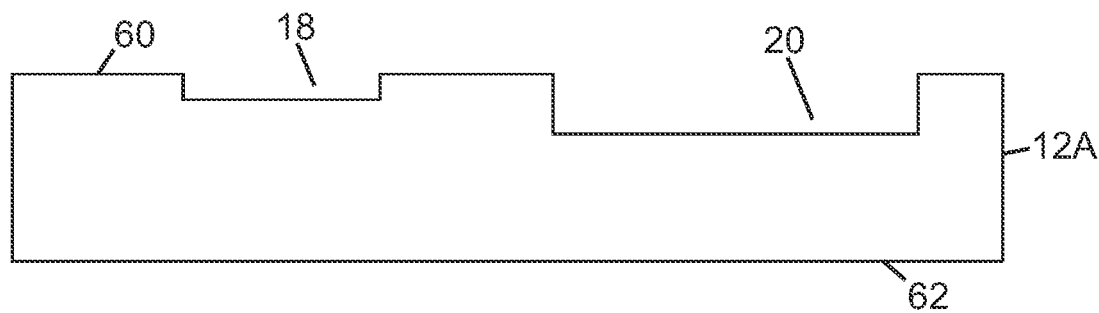
FIG._6D
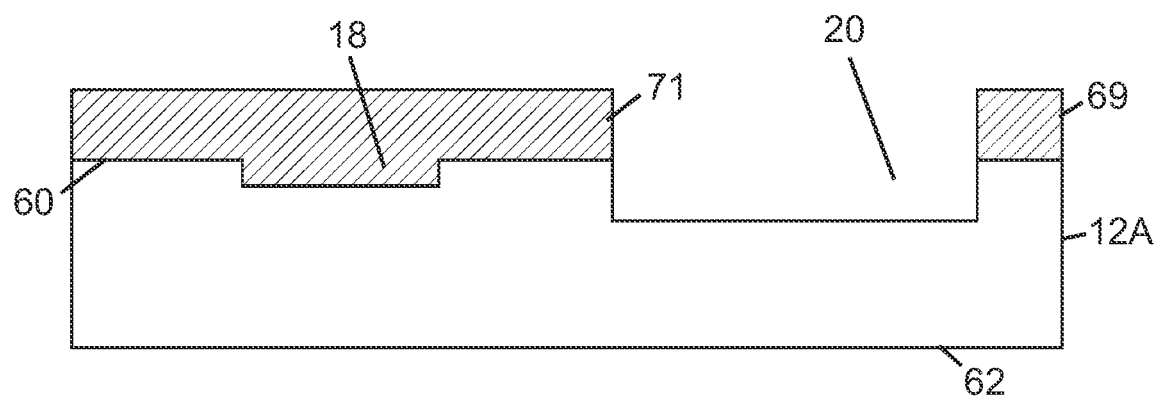
FIG._6E
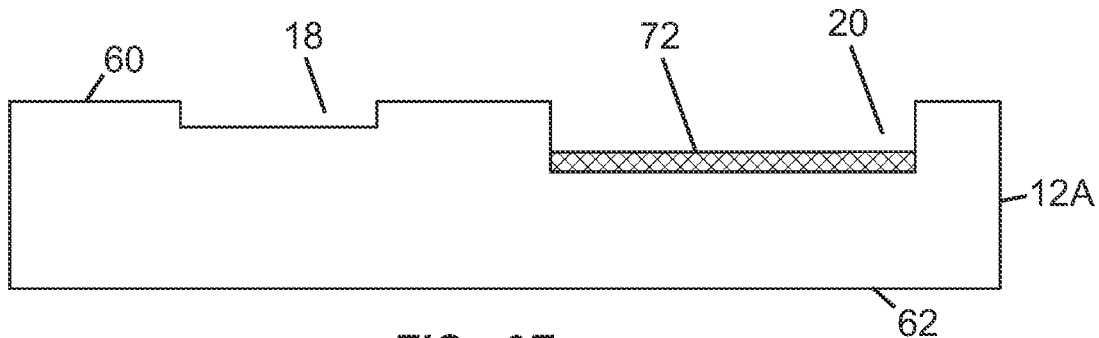
FIG._6F
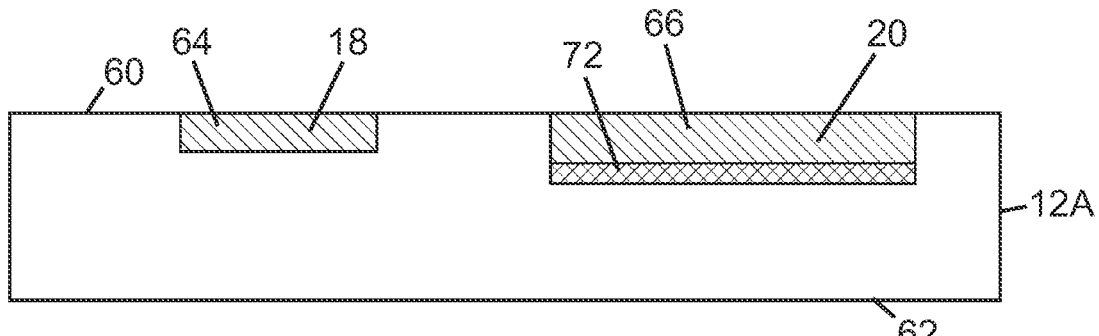
FIG._6G

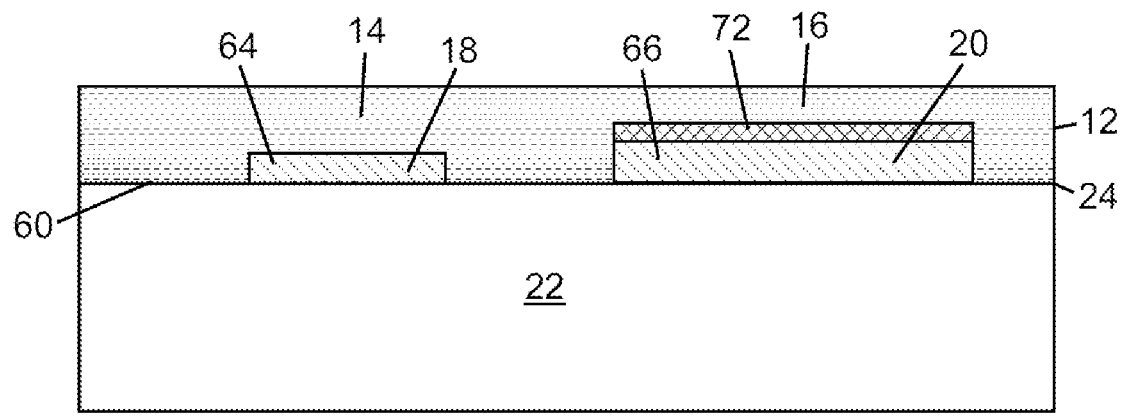
FIG._6H
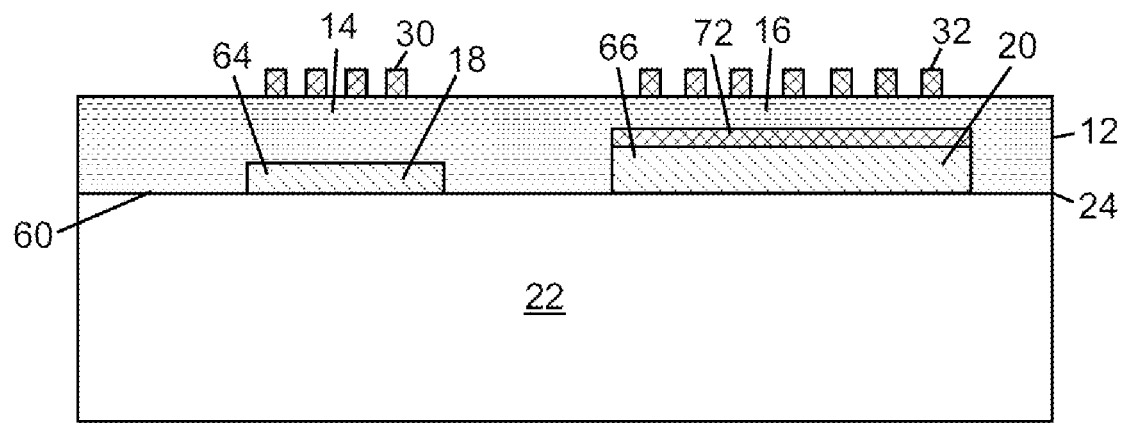
FIG._6I
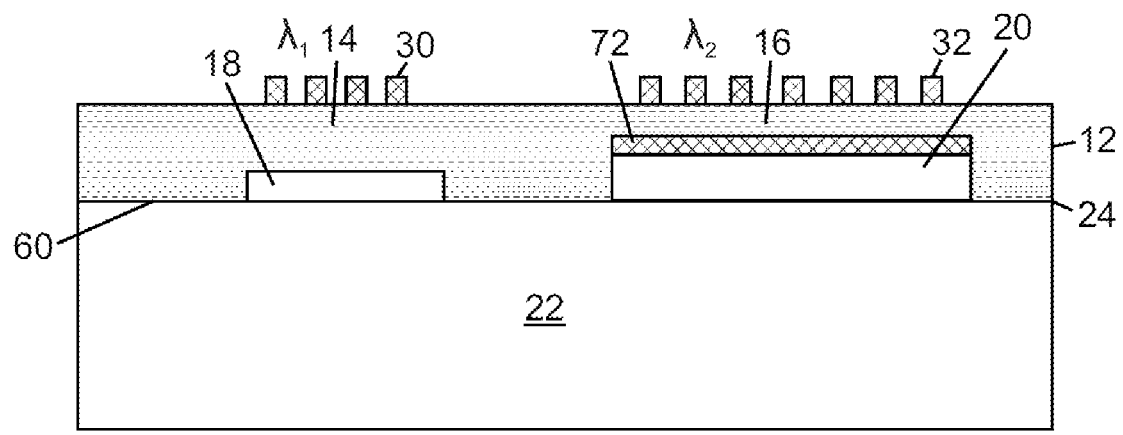
FIG._6J

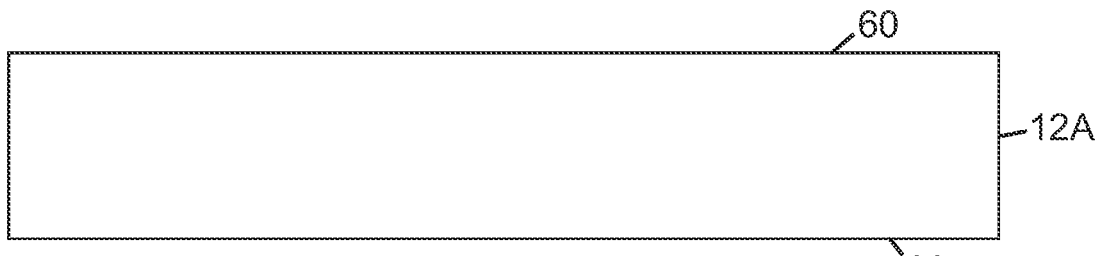
FIG._7A
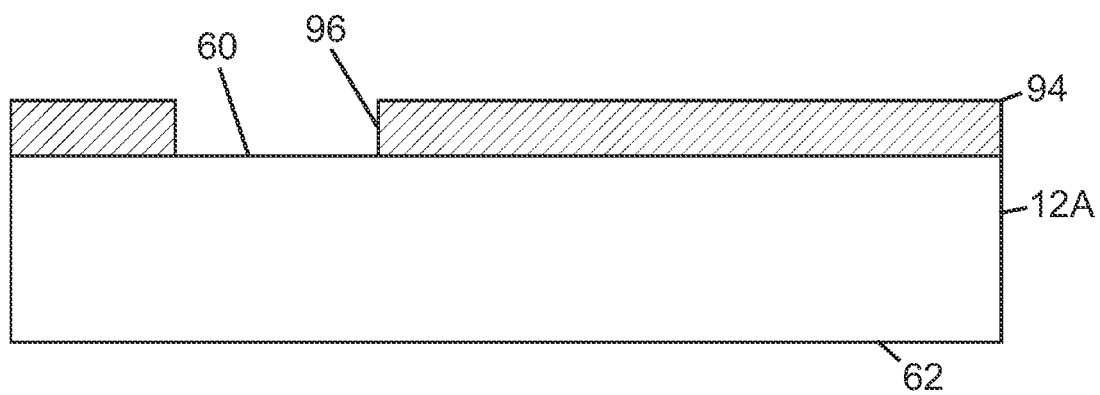
FIG._7B
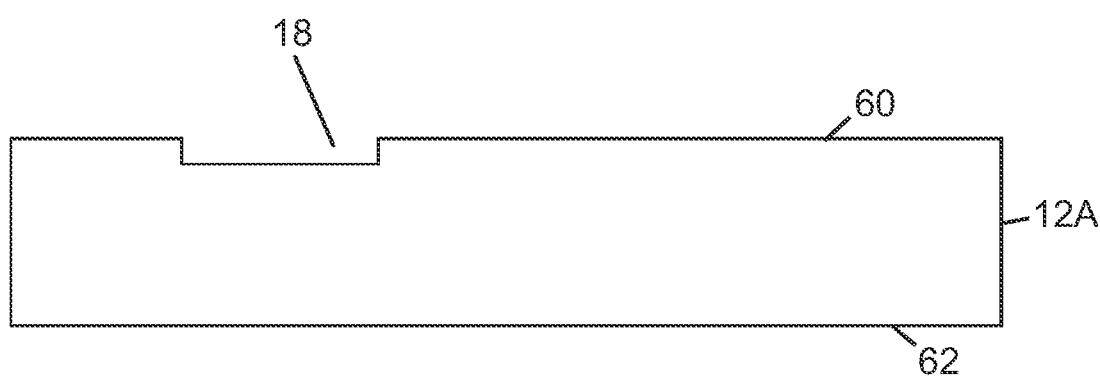
FIG._7C

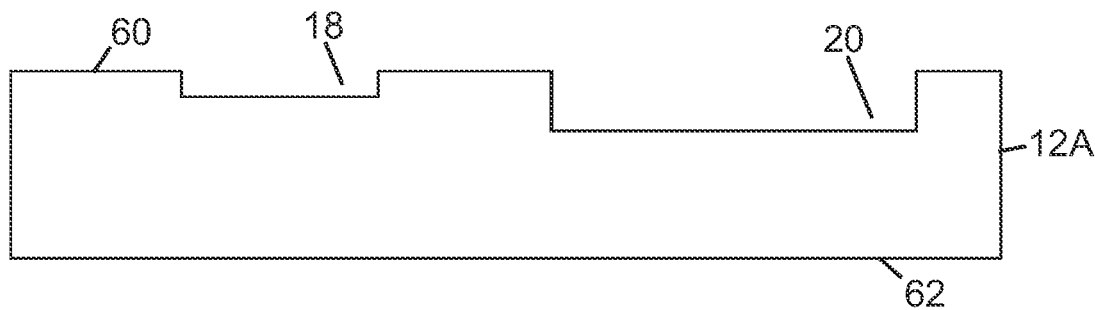
FIG._7D
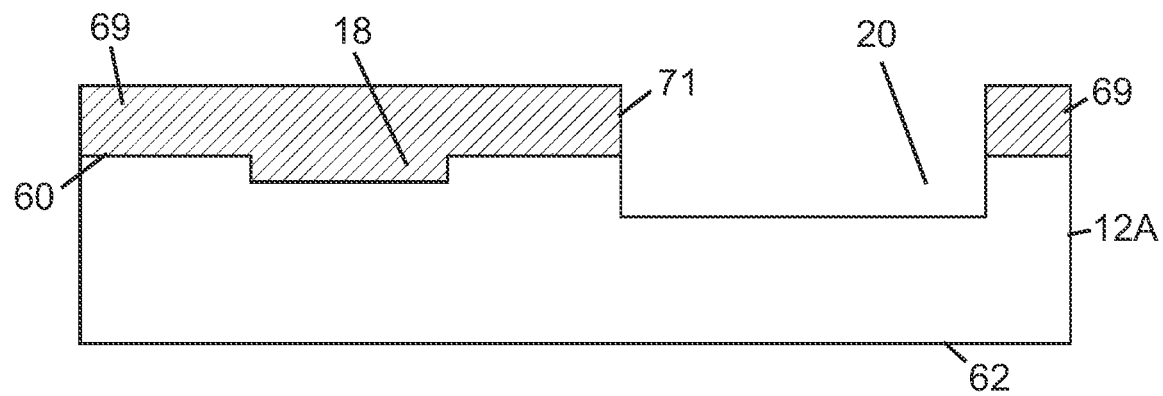
FIG._7E
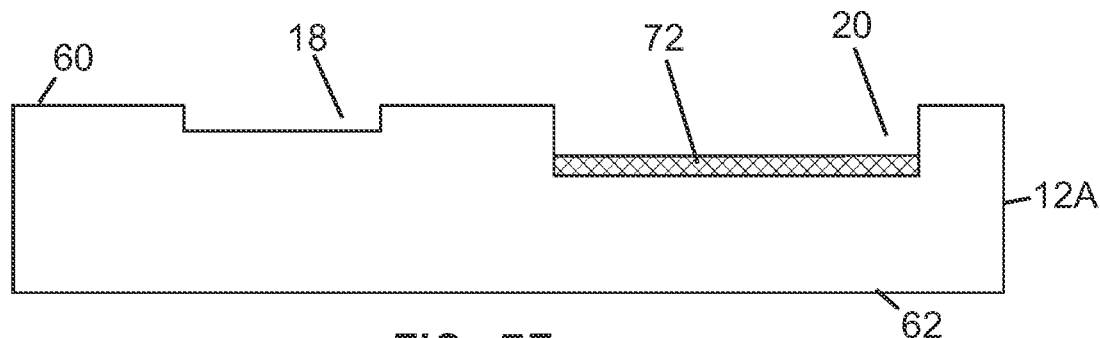
FIG._7F
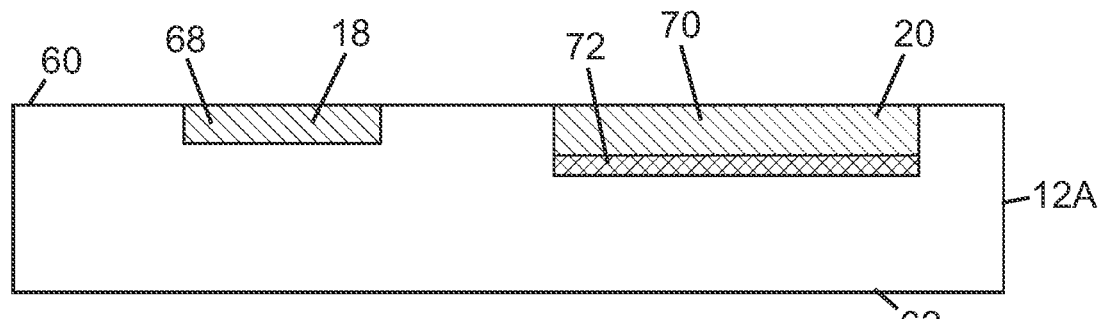
FIG._7G

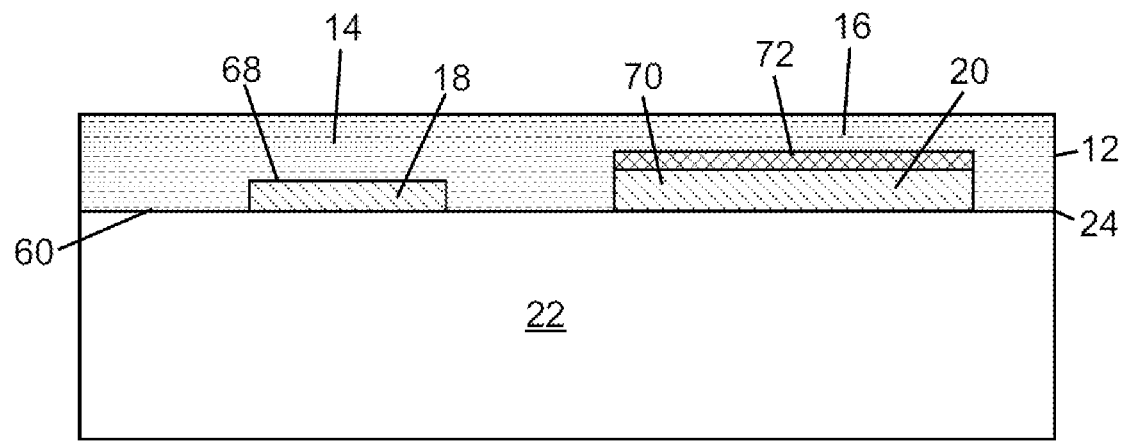
FIG._7H
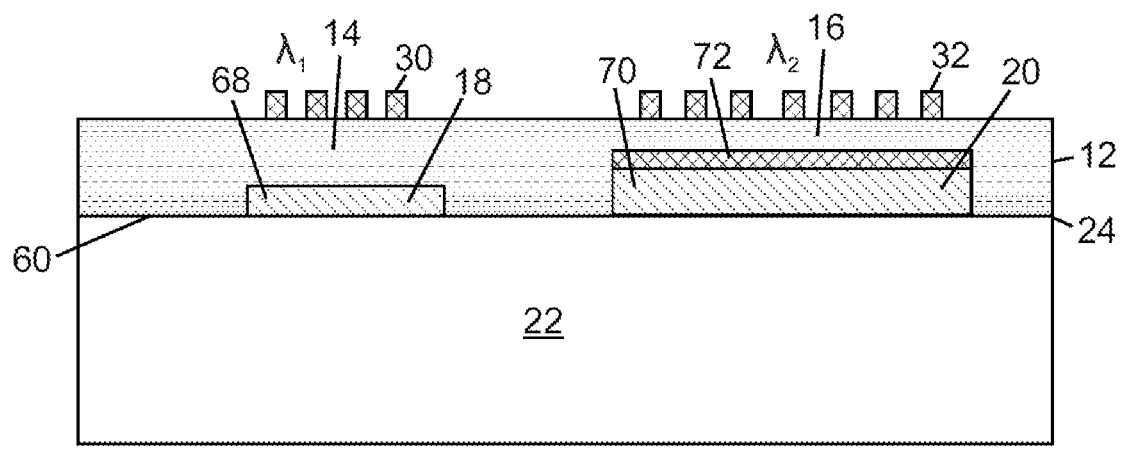
FIG._7I

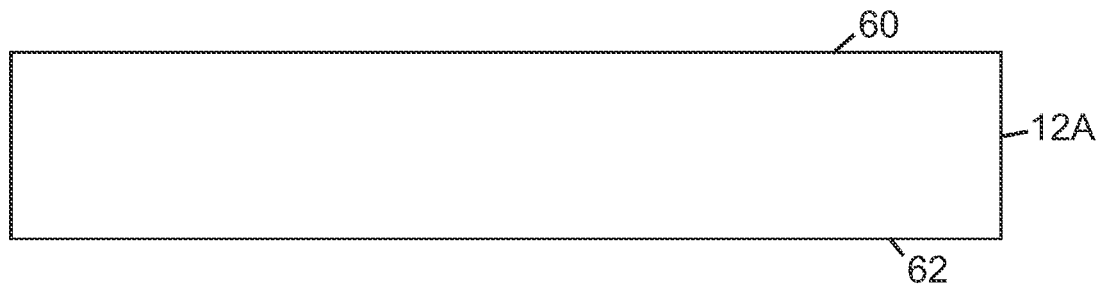
FIG._8A
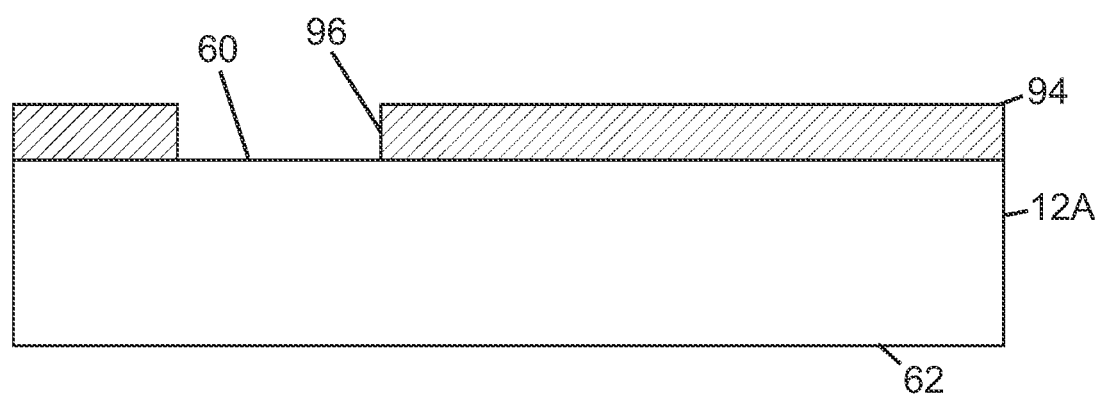
FIG._8B
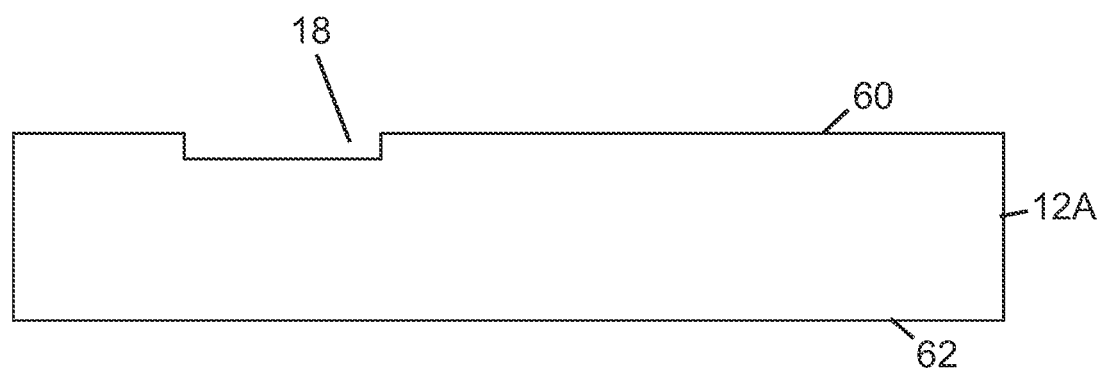
FIG._8C

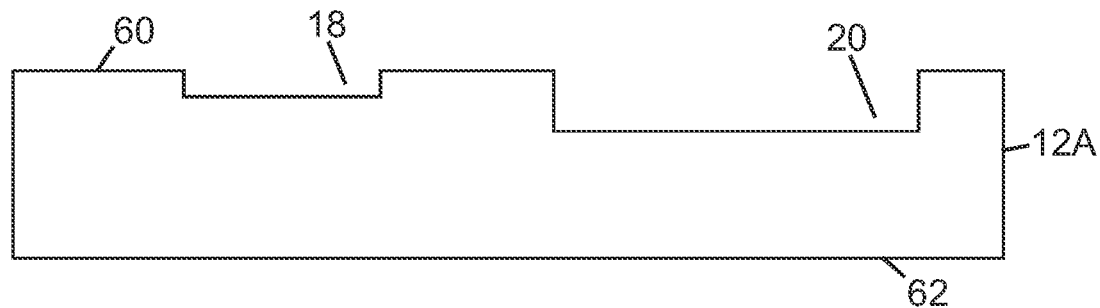
FIG._8D
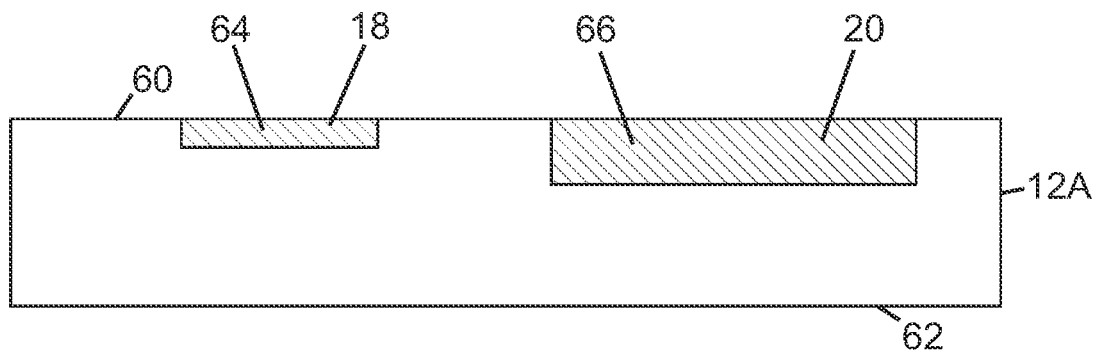
FIG._8E
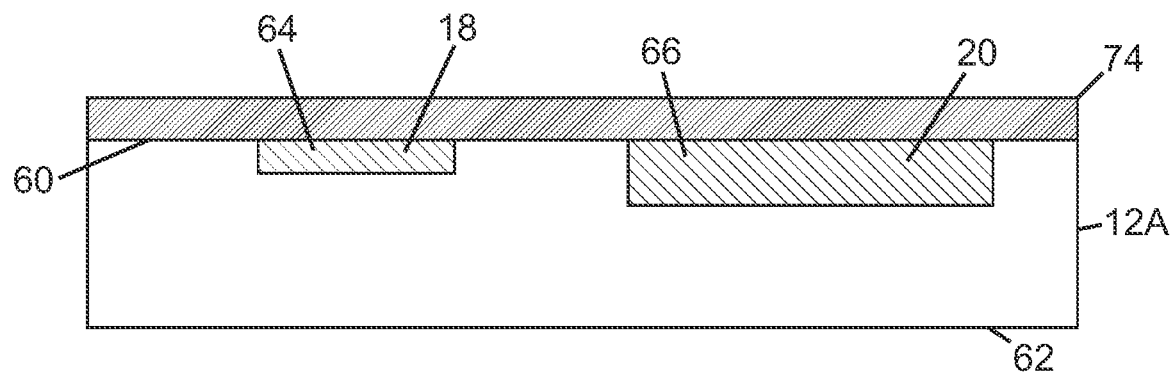
FIG._8F

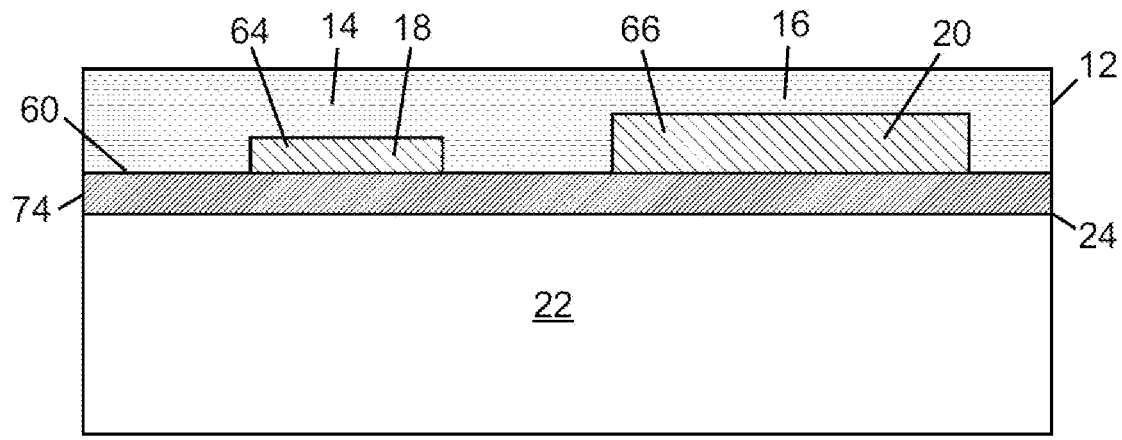
FIG._8G
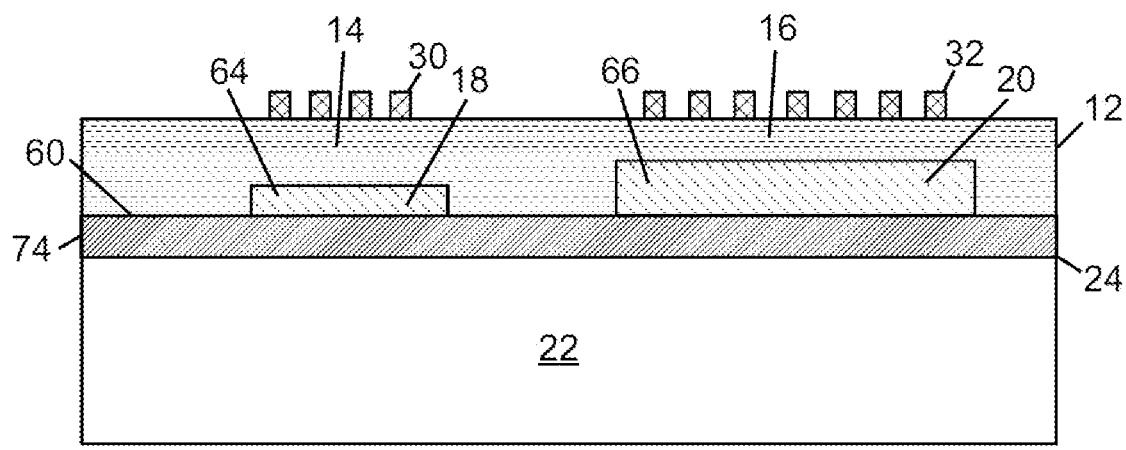
FIG._8H
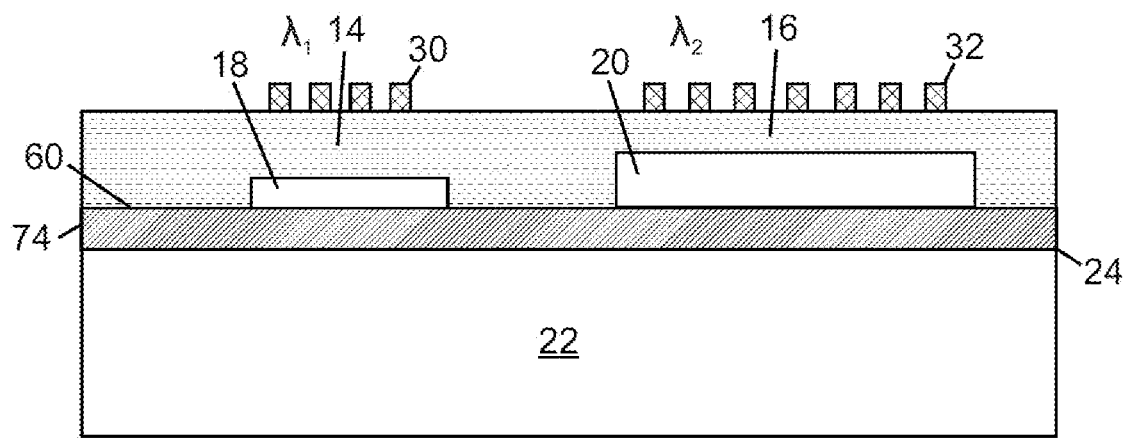
FIG._8I

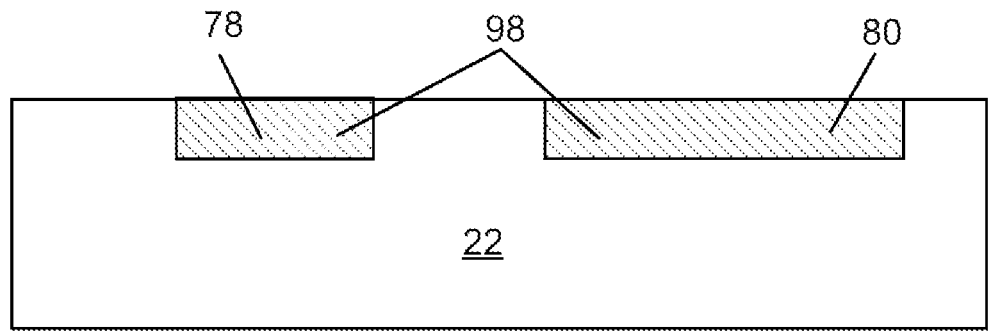
FIG._9A
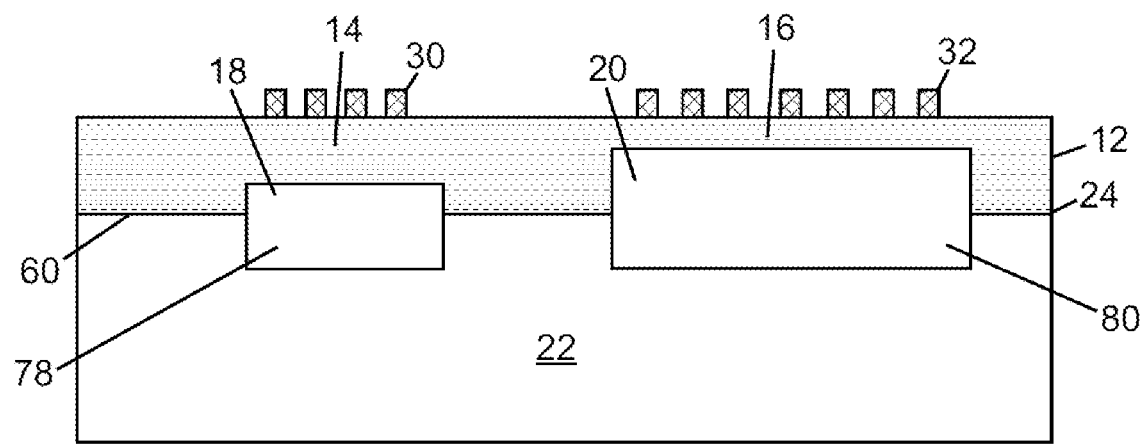
FIG._9B
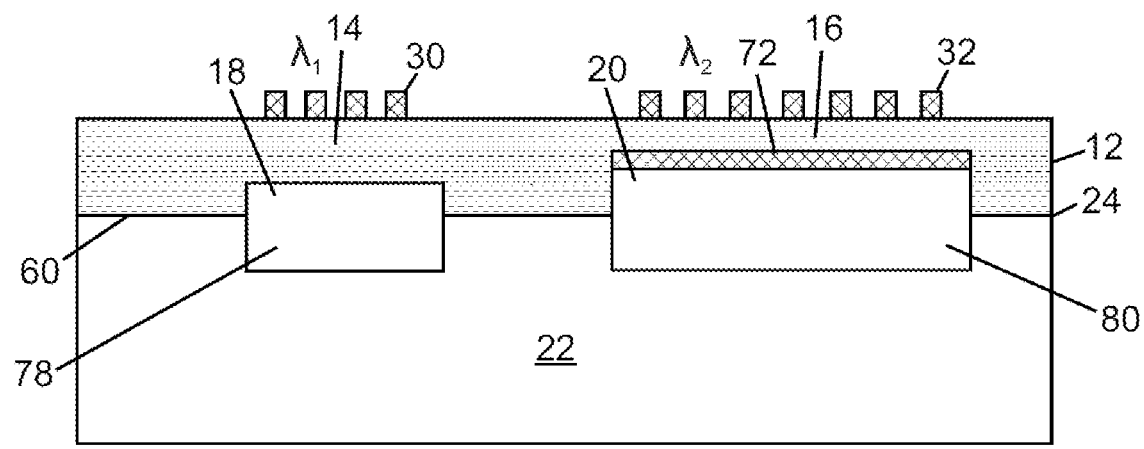
FIG._9C

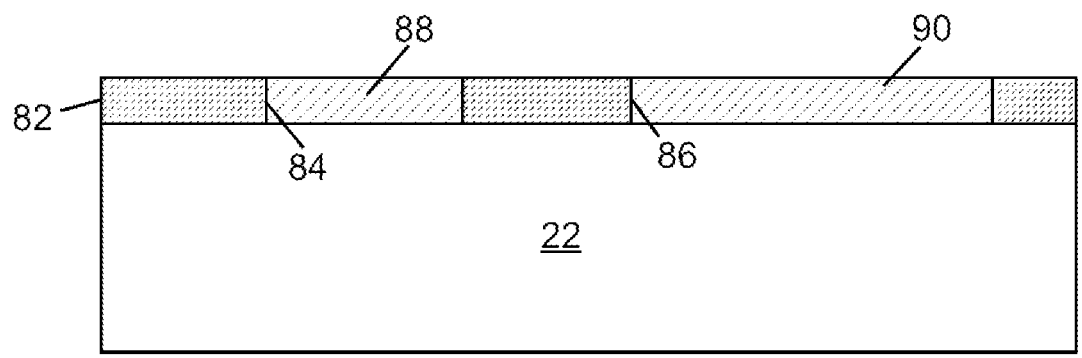
*FIG._10A*
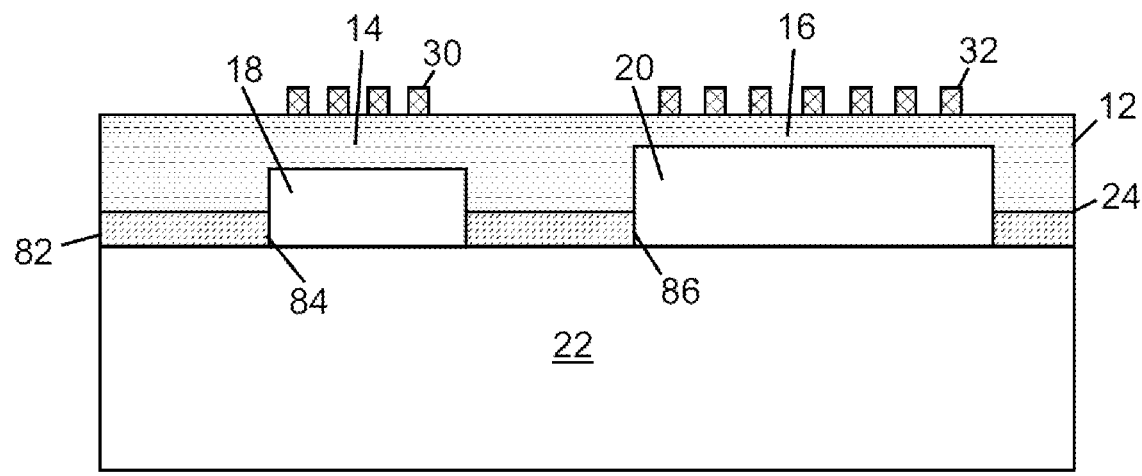
*FIG._10B*
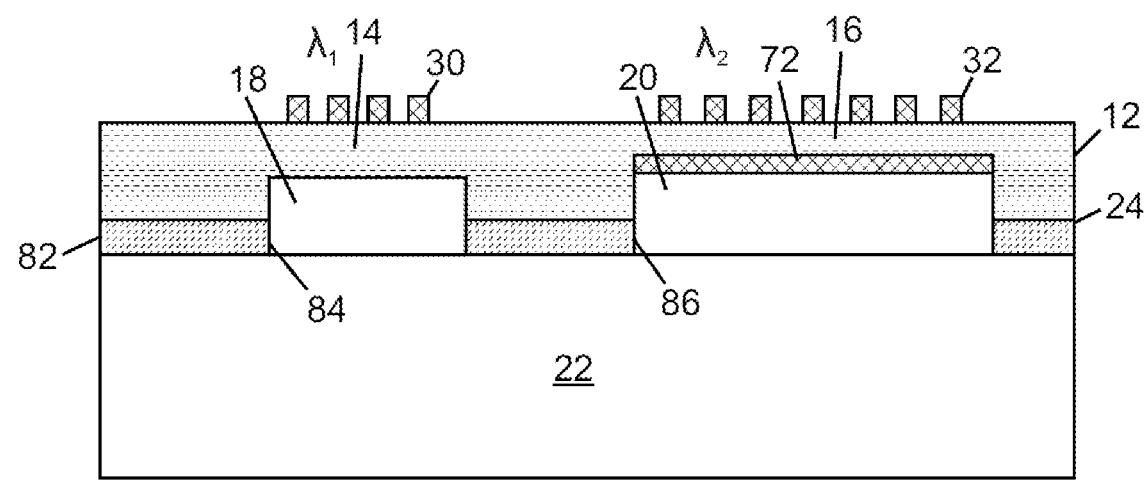
*FIG._10C*

MULTI-FREQUENCY GUIDED WAVE DEVICES AND FABRICATION METHODS

STATEMENT OF RELATED APPLICATIONS

This application is a divisional of U.S. patent application Ser. No. 14/972,929, filed on Dec. 17, 2015 and issuing as U.S. Pat. No. 10,348,269, which is a continuation of International Patent Application No. PCT/US15/66300 filed on Dec. 17, 2015, which is a non-provisional of U.S. Provisional Patent Application No. 62/093,184 filed on Dec. 17, 2014, and is a non-provisional of U.S. Provisional Patent Application No. 62/093,753 filed on Dec. 18, 2014. The entire contents of the foregoing patent and applications are hereby incorporated by reference as if set forth fully herein.

TECHNICAL FIELD

The present disclosure relates to electromechanical components utilizing acoustic wave propagation in piezoelectric layers, and in particular to multi-frequency thin film guided wave structures and methods for making such structures. Such structures may be used, for example, in radio frequency transmission circuits, sensor systems, signal processing systems, and the like.

BACKGROUND

Micro-electrical-mechanical system (MEMS) devices come in a variety of types and are utilized across a broad range of applications. One type of MEMS device that may be used in applications such as radio frequency (RF) circuitry is a MEMS vibrating device (also known as a resonator). A MEMS resonator generally includes a vibrating body in which a piezoelectric layer is in contact with one or more conductive layers. Piezoelectric materials acquire a charge when compressed, twisted, or distorted. This property provides a transducer effect between electrical and mechanical oscillations or vibrations. In a MEMS resonator, an acoustic wave may be excited in a piezoelectric layer in the presence of an alternating electric signal, or propagation of an elastic wave in a piezoelectric material may lead to generation of an electrical signal. Changes in the electrical characteristics of the piezoelectric layer may be utilized by circuitry connected to a MEMS resonator device to perform one or more functions.

Guided wave resonators include MEMS resonator devices in which an acoustic wave is confined in part of a structure, such as in the piezoelectric layer. Confinement may be provided on at least one surface, such as by reflection at a solid/air interface, or by way of an acoustic mirror (e.g., a stack of layers referred to as a Bragg mirror) capable of reflecting acoustic waves. Such confinement may significantly reduce or avoid dissipation of acoustic radiation in a substrate or other carrier structure.

Various types of MEMS resonator devices are known, including devices incorporating interdigital transducer (IDT) electrodes and periodically poled transducers (PPTs) for lateral excitation. Examples of such devices are disclosed in U.S. Pat. Nos. 7,586,239 and 7,898,158 assigned to RF Micro Devices (Greensboro, N.C., USA), wherein the contents of the foregoing patents are hereby incorporated by reference herein. Devices of these types are structurally similar to film bulk acoustic resonator (FBAR) devices, in that they each embody a suspended piezoelectric membrane.

MEMS resonator filter arrays have been studied as a smaller and more highly integrated replacement for the numerous filter dies that currently reside in the radio frequency front-end of a multi-band cellular handset. One method for fabricating multi-frequency MEMS resonator devices including thin plates of lithium niobate is proposed by R. H. Olsson III, et al., "Lamb Wave Micromechanical Resonators Formed in Thin Plates of Lithium Niobate," Solid-State Sensors, Actuators and Microsystems Workshop, Jun. 8-12, 2014, Hilton Head Island, S.C. (hereinafter, "Olsson"). Olsson discloses photolithographic patterning and selective helium ion irradiation (to effectuate helium ion implantation) of a lithium niobate wafer to create a damaged internal release layer, followed by selective etching of the release layer with hydrofluoric acid to form suspended membranes that are overlaid with chromium electrodes. Olsson describes advantages of this process as: (1) the ability to lithographically define the undercut of the device, (2) lack of need for any wafer bonding, polishing, or fracturing, and (3) the ability to realize multiple lithium niobate thicknesses on a single substrate. One limitation associated with processes disclosed by Olsson is that they are not well-suited to create relatively wide areas of uniform thicknesses, owing to the Gaussian profile of an ion implantation beam. Another limitation is that narrow damaged areas may be difficult to release. Yet another limitation associated with processes disclosed by Olsson is their inability to provide electrodes arranged below a suspended membrane. Further limitations with processes according to Olsson are that they require costly ion implantation equipment, and the use of ion implantation has the potential for affecting properties of piezoelectric materials.

Plate wave (also known as lamb wave) resonator devices are also known, such as described in U.S. Patent Application Publication No. 2010-0327995 A1 to Reinhardt et al. ("Reinhardt"). Compared to surface acoustic wave (SAW) devices, plate wave resonators may be fabricated atop silicon or other substrates and may be more easily integrated into radio frequency circuits. Reinhardt discloses a multi-frequency plate wave type resonator device including a silicon substrate, a stack of deposited layers (e.g., SiOC, SiN, $SiO_2$, and Mo) constituting a Bragg mirror, a deposited AlN piezoelectric layer, and a SiN passivation layer. According to Reinhardt, at least one resonator includes a differentiation layer arranged to modify the coupling coefficient of the resonator so as to have a determined useful bandwidth. One limitation of Reinhardt's teaching is that deposition of AlN piezoelectric material (e.g., via epitaxy) over an underlying material having a very different lattice structure generally precludes formation of single crystal material; instead, lower quality material with some deviation from perfect orientation is typically produced. A further limitation is that Reinhardt's approach does not appear to be capable of producing resonators of widely different (e.g., octave difference) frequencies on a single substrate.

Accordingly, there is a need for multi-frequency guided wave devices that can be efficiently manufactured, and that enable production of widely different frequencies on a single substrate. Desirable devices would incorporate high quality piezoelectric materials.

SUMMARY

The present disclosure provides a micro-electrical-mechanical system (MEMS) guided wave device in which a piezoelectric layer includes multiple thinned regions of different thicknesses each bounding in part a different recess, and in which different groups of electrodes are positioned on or adjacent to different thinned regions and arranged for transduction of lateral acoustic waves of different wavelengths in the different thinned regions. A bonded interface is provided between the piezoelectric layer and a substrate layer, such as may embody direct bonding between the piezoelectric layer and the substrate layer, or may include at least one intermediate layer. A bonded interface may be provided between the piezoelectric layer and the substrate layer (wherein the substrate layer further bounds the different recesses), or in certain embodiments, an optional buffer layer may be intermediately arranged between the piezoelectric layer and the substrate layer proximate to or along the bonded interface, wherein the buffer layer may further bound the different recesses). Since lateral mode devices have preferred piezoelectric layer thickness ranges for efficient excitation of lateral waves, providing thinned regions of a piezoelectric layer with different thicknesses enables multiple resonators of different frequencies to be provided in a single guided wave device. The present disclosure also includes a method for producing such devices, including locally thinning a piezoelectric layer to define multiple recesses, bonding the piezoelectric layer on or over a substrate layer to cause the recesses to be bounded in part by either the substrate or an optional buffer layer, and defining multiple groups of electrodes on or over the different thinned regions. In this manner, a multi-frequency MEMS guided wave device including a single crystal piezoelectric layer having multiple thickness regions may be fabricated without use of ion implantation, such that the piezoelectric layer is devoid of any ion implantation affected regions.

Guided wave devices incorporating various electrode configurations disclosed herein include, but are not limited to, interdigital transducers (IDTs) alone, and IDTs in combination with continuous layer electrodes (e.g., usable as floating electrodes or shorting electrodes, to enable launch of asymmetric waves). The wavelength A of an acoustic wave transduced by an IDT equals two times the separation distance between adjacent electrodes (fingers) of opposite polarity, and the wavelength A also equals the separation distance between closest electrodes (fingers) of the same polarity.

In one aspect, a MEMS guided wave device includes a piezoelectric layer including a first recess bounded in part by a first thinned region of the piezoelectric layer including a first thickness, and including a second recess bounded in part by a second thinned region of the piezoelectric layer including a second thickness, wherein the second thickness differs from the first thickness. A first plurality of electrodes is arranged on or adjacent to the first thinned region and is configured for transduction of a lateral acoustic wave having a first wavelength $\lambda_1$ in the first thinned region. A second plurality of electrodes is arranged on or adjacent to the second thinned region and is configured for transduction of a lateral acoustic wave having a second wavelength $\lambda_2$ in the second thinned region. Preferably, the second wavelength $\lambda_2$ differs from the first wavelength $\lambda_1$. A substrate is arranged on or adjacent to the piezoelectric layer. A bonded interface is provided between the piezoelectric layer and the substrate layer. In certain embodiments, a bonded interface is provided between the piezoelectric layer and the substrate layer, wherein the first recess and the second recess are further bounded in part by the substrate layer. In certain embodiments in which a buffer layer is provided, the buffer layer is proximate to or at the bonded interface, and the first recess and the second recess are further bounded in part by the buffer layer. In certain embodiments, the substrate layer and piezoelectric layer are identical with respect to at least one of the following properties: material composition, crystal structure, crystal orientation, or piezoelectricity. In certain embodiments, the substrate layer and piezoelectric layer differ from one another with respect to at least one of the preceding four properties. In certain embodiments, a field layer is intermediately arranged between the piezoelectric layer and the substrate layer, wherein the field layer defines a first field layer aperture substantially registered with the first recess and defines a second field layer aperture substantially registered with the second recess. In certain embodiments, at least one of the first recess or the second recess comprises an unfilled cavity. In certain embodiments, at least one of the first recess or the second recess is filled with a fast wave propagation material or with a slow wave propagation material. In certain embodiments, the substrate layer defines a first substrate recess substantially registered with the first recess, and defines a second substrate recess substantially registered with the second recess. In certain embodiments, at least one of the first recess, the second recess, the first substrate recess, or the second substrate recess comprises an unfilled cavity.

In certain embodiments, the first plurality of electrodes is electrically isolated from the second plurality of electrodes of the MEMS guided wave device. In certain embodiments, the first plurality of electrodes includes a first interdigital transducer (IDT) comprising a first two groups of electrodes of opposing polarity; and the second plurality of electrodes includes a second interdigital transducer (IDT) comprising a second two groups of electrodes of opposing polarity. In certain embodiments, the first IDT comprises a first spacing between adjacent electrodes of opposing polarity of the first two groups of electrodes of opposing polarity, the second IDT comprises a second spacing between adjacent electrodes of opposing polarity of the second two groups of electrodes of opposing polarity, and the second spacing differs from the first spacing. In certain embodiments, the first plurality of electrodes comprises at least one electrode arranged within the first recess, and/or the second plurality of electrodes comprises at least one electrode arranged within the second recess.

In certain embodiments, a MEMS guided wave device includes a substrate having a thickness of greater than at least one of 5 times the first wavelength $\lambda_1$ or 5 times the second wavelength $\lambda_2$. In certain embodiments, the substrate includes a first anchor and a second anchor, wherein at least a portion of the piezoelectric layer including the first thinned region and the second thinned region is suspended between the first anchor and the second anchor. In certain embodiments, the piezoelectric layer comprises single crystal piezoelectric material. In certain embodiments, the piezoelectric layer is devoid of ion implantation affected regions.

In another aspect, a method of fabricating a MEMS guided wave device includes multiple steps. One step includes locally thinning a piezoelectric layer to define a first recess and a second recess in the piezoelectric layer, wherein the first recess is bounded by a first thinned region of the piezoelectric layer comprising a first thickness, the second recess is bounded by a second thinned region of the piezoelectric layer comprising a second thickness, and the second thickness differs from the first thickness. Another step includes bonding the piezoelectric layer on or over a substrate layer, to form a bonded interface. In certain embodiments, a bonded interface is provided between the piezoelectric layer and the substrate layer, wherein the first recess and the second recess are further bounded in part by the substrate layer. A bonded interface may embody direct bonding between the piezoelectric layer and the substrate layer, or may include at least one intermediate layer. In certain embodiments in which a buffer layer is provided (e.g., proximate to or at the bonded interface), the first recess and the second recess are further bounded in part by the buffer layer. Additional steps include defining a first plurality of electrodes arranged on or adjacent to the first thinned region and configured for transduction of a lateral acoustic wave having a wavelength $\lambda_1$ in the first thinned region, and defining a second plurality of electrodes arranged on or adjacent to the second thinned region and configured for transduction of a lateral acoustic wave having a wavelength $\lambda_2$ in the second thinned region. In certain embodiments, the local thinning of the piezoelectric layer to define the first recess and the second recess is performed by etching. In certain embodiments, the method includes depositing a sacrificial material in the first recess and the second recess prior to the bonding step; planarizing at least one surface of the piezoelectric layer after deposition of the sacrificial material; and removing the sacrificial material from the first recess and the second recess after the bonding step. In certain embodiments, the method includes filling at least one of the first recess or the second recess with a fast wave propagation material prior to the bonding step; and prior to the bonding step, planarizing at least one surface of the piezoelectric layer after filling of at least one of the first recess or the second recess. In certain embodiments, the method includes thinning and polishing at least one surface of the piezoelectric layer after the bonding step. In certain embodiments, the method includes defining at least one electrode within the first recess, and/or defining at least one electrode within the second recess. In certain embodiments, the bonding of the piezoelectric layer on or over the substrate layer includes bonding the substrate layer to the piezoelectric layer to cause the first recess and the second recess to be bounded in part by the substrate layer. In certain embodiments, the method includes depositing a buffer layer on one of the piezoelectric layer or the substrate layer, wherein the bonding of the piezoelectric layer on or over the substrate layer includes bonding the other of the piezoelectric layer or the substrate layer to the buffer layer, to cause the first recess and the second recess to be bounded in part by the buffer layer. In certain embodiments, the method includes defining a first substrate recess and a second substrate recess in the substrate layer prior to the bonding step; planarizing at least one surface of the substrate layer after deposition of the sacrificial material; and positioning the piezoelectric layer and the substrate layer relative to one another to substantially register the first substrate recess with the first recess, and to substantially register the second substrate recess with the second recess, prior to the bonding step. In certain embodiments, the method includes depositing the sacrificial material in the first substrate recess and the second substrate recess prior to the positioning step; and removing the sacrificial material from the first substrate recess and the second substrate recess. In certain embodiments, the method includes depositing sacrificial material in the first recess and the second recess; forming a composite layer including field layer regions and including first and second sacrificial material regions over the substrate layer; planarizing at least one surface of the piezoelectric layer and at least one surface of the substrate layer; and prior to the bonding step, aligning the substrate layer and the piezoelectric layer relative to one another to substantially register the first sacrificial material region with the sacrificial material deposited in the first recess, and to register the second sacrificial material region with the sacrificial material deposited in the second recess. In such an instance, the piezoelectric layer is preferably bonded to the field layer regions (and may also be bonded to the sacrificial material regions, but preferably with bonds between the sacrificial material regions and the piezoelectric layer that are weaker than the corresponding bonds between the field layer regions and the piezoelectric layer).

In another aspect, any of the foregoing aspects, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present invention and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the invention, and together with the description serve to explain the principles of the invention. Features in the drawings are not to scale unless specifically indicated to the contrary herein.

FIG. 1A is a top plan view of a MEMS guided wave device including first and second IDTs and corresponding reflector gratings arranged over a piezoelectric layer, with the first IDT and corresponding reflector gratings arranged over a first thinned region of the piezoelectric layer, and with the second IDT and corresponding reflector gratings arranged over a second thinned region of the piezoelectric layer according to one embodiment of the present disclosure.

FIG. 2 is a perspective view of a MEMS guided wave device including an IDT arranged over a thinned region of a piezoelectric layer suspended by narrow mechanical supports over a substrate according to one embodiment of the present disclosure.

FIG. 3 is a perspective view of a MEMS guided wave device including an IDT arranged over a thinned region of a piezoelectric layer suspended by narrow mechanical supports over a substrate, with a field layer arranged between the piezoelectric layer and the substrate, according to one embodiment of the present disclosure.

FIGS. 4A-4H are cross-sectional views of portions of a multi-frequency MEMS guided wave device during various steps of fabrication according to one embodiment of the present disclosure, with the resulting device (shown in FIG. 4H) including first and second thinned piezoelectric material regions of different thicknesses overlaid by IDTs and arranged over first and second unfilled recesses, and with the piezoelectric layer bonded to a substrate.

FIGS. 5A-5G are cross-sectional views of portions of a multi-frequency MEMS guided wave device during various steps of fabrication according to another embodiment of the present disclosure, with the resulting device (shown in FIG. 5G) including first and second thinned piezoelectric material regions of different thicknesses overlaid by IDTs and arranged over first and second filled recesses, and with the piezoelectric layer bonded to a substrate.

FIGS. 6A-6J are cross-sectional views of portions of a multi-frequency MEMS guided wave device during various steps of fabrication according to one embodiment of the present disclosure, with the resulting device (shown in FIG.

Figure 1B:
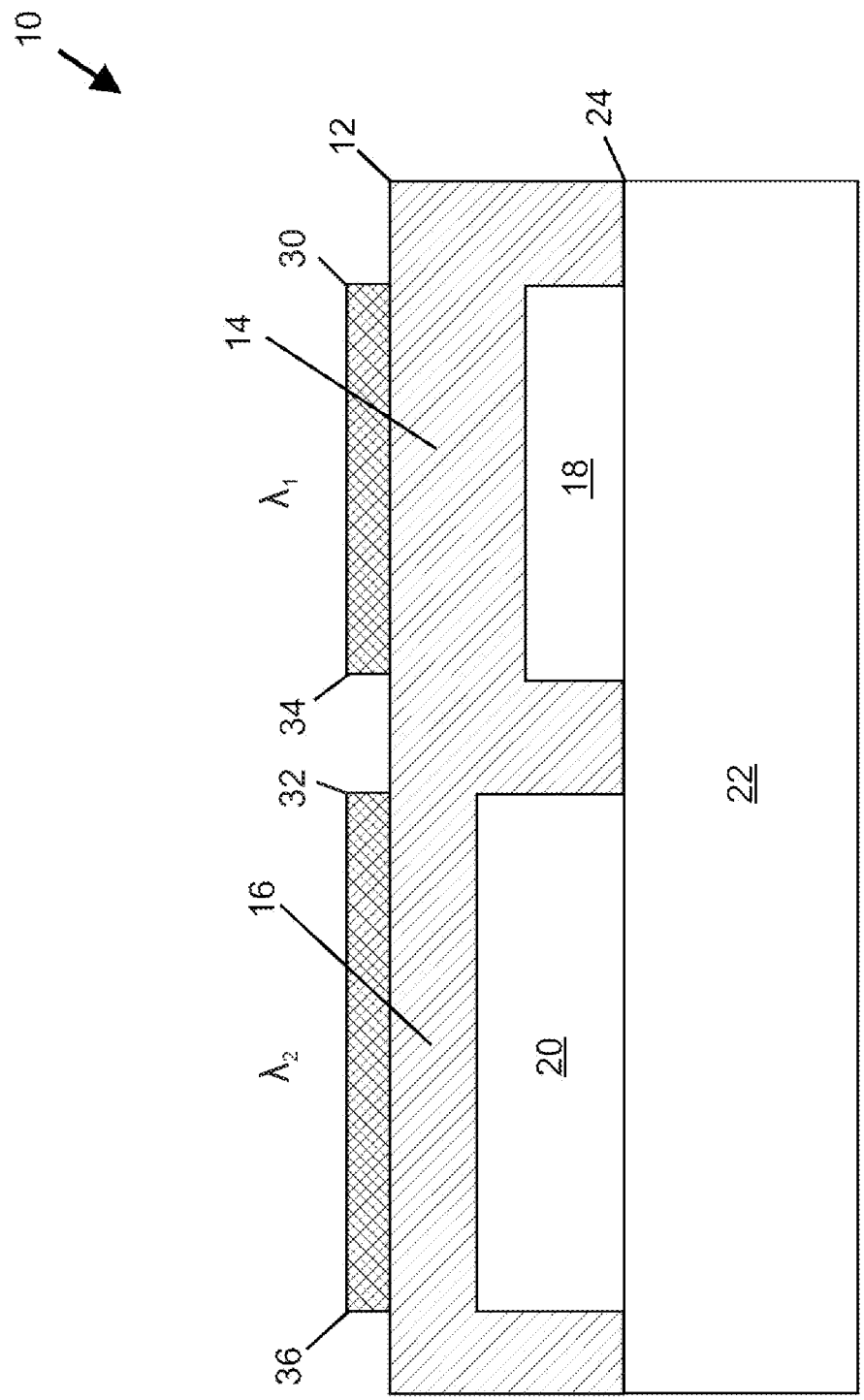
FIG. 1B is a cross-sectional view of the MEMS guided wave device of FIG. 1A taken along section lines "A-A" illustrated in FIG. 1A.

6J) including first and second thinned piezoelectric material regions of different thicknesses overlaid by IDTs and arranged over first and second unfilled recesses, wherein an electrode is provided within the second recess, and with the piezoelectric layer bonded to a substrate.

FIGS. 7A-7I are cross-sectional views of portions of a multi-frequency MEMS guided wave device during various steps of fabrication according to one embodiment of the present disclosure, with the resulting device (shown in FIG. 7I) including first and second thinned piezoelectric material regions of different thicknesses overlaid by IDTs and arranged over first and second filled recesses, wherein an electrode is provided within the second recess, and the piezoelectric layer is bonded to a substrate.

FIGS. 8A-8I are cross-sectional views of portions of a multi-frequency MEMS guided wave device during various steps of fabrication according to one embodiment of the present disclosure, with the resulting device (shown in FIG. 8I) including first and second thinned piezoelectric material regions of different thicknesses overlaid by IDTs and arranged over first and second unfilled recesses, and with a buffer layer being arranged between the piezoelectric layer and a substrate.

FIG. 9A is a cross-sectional view of a substrate defining two recesses containing sacrificial material, and suitable for use in fabricating multi-frequency MEMS guided wave devices according to FIGS. 9B and 9C.

FIG. 9B is a cross-sectional view of a multi-frequency MEMS guided wave device similar to the device of FIG. 4H, but including the substrate of FIG. 9A following removal of the sacrificial material, wherein the recesses defined in the substrate are substantially registered with unfilled recesses defined below the first and second thinned regions of the piezoelectric layer.

FIG. 9C is a cross-sectional view of a multi-frequency MEMS guided wave device similar to the device of FIG. 9B, but with inclusion of an electrode provided in the second recess defined in the piezoelectric layer.

FIG. 10A is a cross-sectional view of a substrate overlaid with a composite layer including field layer regions as well as first and second sacrificial layer regions, with the substrate and composite layer being suitable for use in fabricating multi-frequency MEMS guided wave devices according to FIGS. 10B and 10C.

FIG. 10B is a cross-sectional view of a multi-frequency MEMS guided wave device similar to the device of FIG. 4H, but including the substrate of FIG. 10A following removal of the sacrificial material to yield unfilled apertures in the field layer material, wherein the apertures defined in the field layer material are substantially registered with unfilled recesses defined below the first and second thinned regions of the piezoelectric layer.

FIG. 10C is a cross-sectional view of a multi-frequency MEMS guided wave device similar to the device of FIG. 10B, but with inclusion of an electrode provided in the second recess defined in the piezoelectric layer.

DETAILED DESCRIPTION

Embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof. As used herein, the terms "proximate" and "adjacent" as applied to a specified layer or element refers to a state of being close or near to an other layer or element, and encompass the possible presence of one or more intervening layers or elements without necessarily requiring the specified layer or element to be directly on or directly in contact with the other layer or element unless specified to the contrary herein.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates in one aspect to a microelectrical-mechanical system (MEMS) guided wave device in which a piezoelectric layer includes multiple thinned regions of different thicknesses each bounding in part a different recess, and different groups of electrodes are positioned on or adjacent to different thinned regions and arranged for transduction of lateral acoustic waves of different wavelengths in the different thinned regions. A bonded interface is provided between the piezoelectric layer and either a substrate or an optional buffer layer, wherein either the substrate or the optional buffer layer further bounds the different recesses.

By forming multiple different thinned regions of a piezoelectric layer and then bonding the piezoelectric layer to an underlying layer along a bonded interface, the need for ion implantation to create a damaged internal release layer (according to prior methods) is eliminated, and new capabilities are provided—such as the ability to provide one or more electrodes and/or different materials (such as fast wave propagation material or slow wave propagation material)

within recesses below thinned regions of a piezoelectric layer according to certain embodiments of the present disclosure. Moreover, in certain embodiments, removal of sacrificial material may be aided by substantially registering recesses in a substrate with recesses below thinned regions of a piezoelectric layer, and/or by arranging a field layer between a selectively thinned piezoelectric layer and a substrate layer, with apertures defined in the field layer being substantially registered with recesses below thinned regions of a piezoelectric layer. The foregoing configurations that aid removal of sacrificial material may enable formation of features and geometries that would be difficult to achieve in a reproducible way using prior methods relying upon ion implantation to create a damaged internal release layer of piezoelectric material.

In certain embodiments, vertical holes may be defined in a piezoelectric layer (preferably spaced apart from electrodes) to enable passage of one or more liquids suitable to promote removal of sacrificial material arranged within or below the piezoelectric material (e.g., within recesses previously defined below thinned regions thereof). In certain embodiments, lateral access may be provided to sacrificial material arranged within or below a piezoelectric layer, thereby obviating the need for vertical holes to enable removal of sacrificial material.

The terms "fast wave propagation material" or "fast wave propagation layer" refers to a material or layer in which an acoustic wave of interest travels more quickly than in a proximate piezoelectric layer in which the acoustic wave is transduced. Similarly, the terms "slow wave propagation material" or "slow wave propagation layer" refers to a material or layer in which an acoustic wave of interest travels more slowly than in a proximate piezoelectric layer in which the acoustic wave is transduced. Examples of fast wave propagation materials that may be used according to certain embodiments include (but are not limited to) diamond, sapphire, aluminum nitride, silicon carbide, boron nitride, and silicon. An example of a slow wave propagation material that may be used according to certain embodiments includes (but is not limited to) silicon dioxide. Silicon dioxide also represents a preferred sacrificial material that may be used in certain embodiments. In certain embodiments, fast wave propagation material may be provided proximate to a thinned region of a piezoelectric layer to confine a laterally excited wave in the piezoelectric layer. Such confinement may significantly reduce or avoid dissipation of acoustic radiation in a substrate or other carrier structure.

In certain embodiments, MEMS guided wave devices described herein may have dominant lateral vibrations. Such devices may desirably use single crystal piezoelectric layer materials, such as lithium tantalate or lithium niobate. Such devices may also provide vibrating structures with precise sizes and shapes, which may provide high accuracy, and enable fabrication of multiple resonators having different resonant frequencies on a single substrate. Although lithium niobate and lithium tantalate are particularly preferred piezoelectric materials, in certain embodiments any suitable piezoelectric materials may be used, such as quartz, a piezoceramic, or a deposited piezoelectric material (such as aluminum nitride or zinc oxide). Substrates of any suitable materials may be used, such as silicon, glass, ceramic, etc. In certain embodiments, a substrate may additionally or alternatively comprise a piezoelectric material, which may be of the same or different composition in comparison to the piezoelectric layer in which thinned regions are formed for transduction of acoustic waves.

In certain embodiments, at least two different resonators in a single device are configured to produce wavelengths at least one octave apart. In certain embodiments, at least one first resonator is configured to operate at or around 900 MHz, and at least one second resonator is configured to operate at or around 1800 MHz or 2.4 GHz.

Vibrating structures of preferred MEMS guided wave devices described herein are formed of single crystal piezoelectric material and use mechanically efficient MEMS construction. Such vibrating structures may be high-Q, low loss, stable, at a low temperature coefficient of frequency, have a high electromechanical coupling efficient, have high repeatability, and have a low motional impedance. In certain embodiments, a nonstandard (e.g., offcut) crystalline orientation of the single crystal piezoelectric material may be used to provide specific vibrational characteristics, such as a low temperature coefficient of frequency, a high electromechanical coupling coefficient, or both. Since it is extremely difficult to grow single crystal piezoelectric material (e.g., via epitaxy) over non-lattice-matched materials, in preferred embodiments, single crystal piezoelectric materials are pre-fabricated (e.g., by growth of a boule followed by formation of thin wafers), surface finished (e.g., via chemical mechanical planarization (CMP) and polishing to provide near-atomic flatness), and bonded to one or more underlying layers. Any suitable wafer bonding technique known in the art may be used, such as may rely on van der Waals bonds, hydrogen bonds, covalent bond, and/or mechanical interlocking. In certain embodiments, direct bonding may be used. In certain embodiments, bonding may include one or more surface activation steps (e.g., plasma treatment, chemical treatment, and/or other treatment methods) followed by application of heat and/or pressure, optionally followed by one or more annealing steps. Such bonding results in formation of a bonded interface between the piezoelectric layer and at least one underlying layer. In certain embodiments, the bonded interface may include at least one intervening layer arranged on at least a portion of (or the entirety of) a surface of the substrate. Suitable electrodes may be defined on and/or in the piezoelectric layer for transduction of a first lateral acoustic wave in a first thinned region of the piezoelectric material, and for transduction of a second lateral acoustic wave in a second thinned region of the piezoelectric material.

In certain embodiments, a thinned region of a piezoelectric layer as disclosed herein preferably includes a thickness of no greater than 2 times the wavelength $\lambda$ (more preferably no greater than 1 times the wavelength, or no greater than 0.5 times the wavelength) of a lateral acoustic wave transduced in the thinned region.

Guided wave devices as disclosed herein may incorporate various combinations of electrode configurations as illustrated in the drawings and described herein. Exemplary configurations disclosed herein include, but are not limited to, interdigital transducers (IDTs) alone, and IDTs in combination with continuous layer (e.g., floating) electrodes. An IDT includes electrodes with a first conducting section and a second conducting section that are inter-digitally dispersed in or on a surface or layer. IDTs are well known in the art, and may be defined by single-step or multi-step photolithographic patterning. In certain embodiments, electrodes may be provided in the form of periodically poled transducers, in which a first set of domains has a nominal domain orientation, a second set of domains has an inverted domain, and the nominal and inverted domains are alternately arranged within a periodically poled piezoelectric layer.

In certain embodiments, at least one functional layer is arranged to at least partially cover at least some electrodes of a plurality of electrodes. In certain embodiments, at least one functional layer covers one group of electrodes, but does not cover another group of electrodes. A functional layer may modify velocity of a transduced acoustic wave and/or alter temperature compensation properties of a MEMS guided wave device. In certain embodiments, at least one functional layer includes a temperature compensation material or a slow wave propagation material.

Although various figures herein include two resonators (or one resonator in some instances), it is to be appreciated that any suitable combinations of two or more resonators and/or reflector gratings in series and/or in parallel (such as may be embodied in one or more filters) may be provided in a single MEMS guided wave device. In certain embodiments, multiple resonators and/or filters arranged for transduction of acoustic waves of different wavelengths may be provided in a single MEMS guided wave device. In certain embodiments, multiple thinned regions of a piezoelectric layer may be formed, and multiple resonators and/or filters may be defined over each thinned region.

FIGS. 1A and 1B illustrate a MEMS guided wave device 10 according to one embodiment of the present disclosure. The device 10 includes a piezoelectric layer 12 (e.g., a single crystal material such as lithium niobate or lithium tantalate) on top side electrodes in the form of a first IDT 30 and a second IDT 32 provided between respective pairs of reflector gratings 34, 36. The IDTs 30, 32 and the reflector gratings 34, 36 include a number of fingers 28 that are connected to respective bus bars 26. For the reflector gratings 34, 36, all fingers 28 connect to each bus bar 26. For the IDTs 30, 32, alternating fingers 28 connect to different bus bars 26, as depicted. Notably, actual reflector gratings 34, 36 and IDTs 30, 32 may include larger numbers of fingers 28 than illustrated.

For each IDT 30, 32, the fingers 28 are parallel to one another and aligned in an acoustic region that encompasses the area in which the IDT 30, 32 and its corresponding reflector gratings 34, 36 reside. For each IDT 30, 32, the wave or waves generated when the IDT 30, 32 is excited with electrical signals essentially reside in this acoustic region. Acoustic waves essentially travel perpendicular to the length of the fingers 28. The operating frequency of each resonator of the MEMS guided wave device 10 is a function of the pitch representing the spacing between fingers 28 of each respective IDT 30, 32. A first pitch (P1) represents the spacing between fingers 28 of the first IDT 30. A second pitch (P2) represents the spacing between fingers 28 of the second IDT 32. The wavelength λ of an acoustic wave transduced by an IDT equals two times the pitch or separation distance between adjacent electrodes (fingers) of opposite polarity, and the wavelength λ also equals the separation distance between closest electrodes (fingers) of the same polarity.

Lateral mode devices have preferred thickness ranges for a piezoelectric layer to promote efficient excitation of lateral waves. Since the first and second IDTs 30, 32 are intended for transduction of lateral acoustic waves having wavelengths that differ from one another, the piezoelectric layer 12 includes first and second thinned regions 14, 16 underneath the first and second IDTs 30, 32 (and reflector gratings 34, 36), respectively. As shown in FIG. 1B, these thinned regions 14, 16 underneath the first and second IDTs 30, 32 have thicknesses that differ from one another, and thereby bound (from above) recesses 18, 20 of different height dimensions. The first IDT 30 is configured for transduction of a lateral acoustic wave having a first wavelength $\lambda_1$ in the first thinned region 14, and the second IDT 32 is configured for transduction of a lateral acoustic wave having a second wavelength $\lambda_2$ in the second thinned region 16. The piezoelectric layer 12 is directly bonded to a substrate 22 along a bonded interface 24, causing the recesses 18, 20 to be bounded from below by the substrate 22. The term "recess" as used herein refers to an inwardly extending feature defined in at least one surface of a bulk material (e.g., a piezoelectric layer) from which the bulk material has been removed or is otherwise absent. In certain embodiments, a recess may embody an unfilled cavity. In other embodiments, a recess may contain (e.g., may be partially or completely filled with) a material having a composition that is dissimilar from the bulk material in which the recess is defined. In certain embodiments, at least one recess defined in a piezoelectric layer may include (e.g., be partially or completely filled with) one or more of: an electrode, a fast wave propagation material, a slow wave propagation material, or a sacrificial material. Although various embodiments disclosed herein illustrate recesses embodying unfilled cavities, it is specifically contemplated that in alternative embodiments, one, some, or all recesses defined in a piezoelectric layer may be partially or completely filled with a fast wave propagation material or with a slow wave propagation material, In certain embodiments, sacrificial material (such as, but not limited to, silicon dioxide) may be provided within the recesses 18, 20 during fabrication, in order to provide an uninterrupted surface to promote direct bonding to a substrate, and thereby avoid distortion of features that otherwise would be suspended in the absence of sacrificial material. In certain embodiments, vertical holes 38 may be defined through the piezoelectric layer 12 to enable passage of one or more liquids suitable to promote removal of any sacrificial material present in recesses defined in the piezoelectric layer 12 proximate to the bonded interface 24. Further details regarding methods of fabricating devices similar to the device 10 of FIGS. 1A-1B are described hereinafter, following the descriptions of FIGS. 2 and 3.

FIG. 2 illustrates a MEMS guided wave device 52 including an IDT 32 arranged over a thinned region 14 of a piezoelectric layer 12 suspended by narrow mechanical supports 44, 46 over a substrate 22 and between anchor portions 48, 50 according to one embodiment of the present disclosure. A conductive layer including first and second conductive sections 40, 42 is arranged on the piezoelectric layer 12 to form the IDT 32 including fingers 28. The thinned region 14 is separated from a top surface of the substrate 22 by a recess 18. As shown in FIG. 2, the recess 18 embodies an unfilled cavity extending laterally beyond the thinned region 14 of the piezoelectric layer 12 as well as the IDT 32. In certain embodiments, the thinned region 14 may be defined in a piezoelectric wafer by etching to form the recess 18, followed by addition of sacrificial material to the recess 18, followed by surface finishing of the piezoelectric material and sacrificial material (e.g., via chemical mechanical planarization (CMP) and polishing to provide near-atomic flatness), followed by bonding of the finished surface (including the piezoelectric material) to the substrate 22, followed by deposition of the IDT 32, followed by removal of the sacrificial material to cause the recess 18 to embody an unfilled cavity. The presence of sacrificial material avoids presence of internal cavities during the bonding step and IDT deposition steps, thereby promoting integrity of the resulting structure (e.g., by avoiding distortion of the suspended and thinned region 14 of the piezoelectric layer 12).

Although FIG. 2 depicts a single resonator for clarity of illustration, it is to be appreciated that in preferred embodiments, multiple resonators may be present, each including a different thinned region of the piezoelectric layer and each including multiple electrodes (e.g., an IDT), wherein different IDTs are configured for transduction of lateral acoustic waves of different wavelengths in the different thinned regions. When multiple resonators are provided, in preferred embodiments the electrodes (e.g., IDTs) of the respective resonators are electrically isolated from one another.

In certain embodiments, a field layer may be intermediately arranged between a piezoelectric layer and a substrate layer, wherein the field layer defines one or more apertures substantially registered with one or more recesses bounded in part by locally thinned regions of the piezoelectric layer. Presence of an intermediate field layer increases spacing between a piezoelectric layer and a substrate, while presence of field layer apertures substantially registered with recesses defined in the piezoelectric layer may beneficially aid in removing any sacrificial material contained within the recesses.

FIG. 3 illustrates a MEMS guided wave device 56 similar to the device 52 illustrated in FIG. 2, but with addition of a field layer 54 intermediately arranged between the piezoelectric layer 12 and the substrate 22, with the field layer 54 including an aperture registered with a recess 18 below the thinned region 14 of the piezoelectric layer 12. Presence of the field layer 54 increases spacing between the piezoelectric layer 12 and the substrate 22. Such spacing provided by the field layer 54 may beneficially aid in removing any sacrificial material present in the recess 18 during manufacture of the device 56. The device 56 includes an IDT 32 arranged over the thinned region 14 of the piezoelectric layer 12, with the thinned region 14 being suspended by narrow mechanical supports 44, 46 over the substrate 22 and between anchor portions 48, 50. In certain embodiments, the device 56 may be fabricated in multiple steps, such as those that follow. The thinned region 14 may be defined in a piezoelectric wafer by etching to form the recess 18, followed by addition of sacrificial material to the recess 18, followed by surface finishing of the piezoelectric material and sacrificial material (e.g., via chemical mechanical planarization (CMP) and polishing to provide near-atomic flatness). Separately, the substrate 22 may be overlaid with a composite layer including field layer material regions as well as sacrificial material regions contained in an aperture within the field layer material regions, and the composite layer may be surface finished. Thereafter, two finished surfaces (corresponding to the piezoelectric layer 12 and the field layer 54) are bonded to form a bonded interface, the IDT 32 is deposited thereover, and sacrificial material is removed from below the thinned region 14 of the piezoelectric layer 12 as well as from an aperture defined in the field layer material regions to expose the recess 18, which spans portions of the piezoelectric layer 12 and the field layer 54. The resulting structure includes the IDT 32 and the thinned region 14 of the piezoelectric layer 12 being suspended over the substrate 22, with a recess 18 being bounded from above by the thinned region 14, bounded from below by the substrate 22, and bounded along at least two sides by the field layer 54. As shown in FIG. 3, the recess 18 embodies an unfilled cavity extending laterally beyond the thinned region 14 of the piezoelectric layer 12 as well as the IDT 32.

Although FIG. 3 depicts a single resonator for clarity of illustration, it is to be appreciated that in preferred embodiments, multiple resonators may be present, each including a different thinned region of the piezoelectric layer and each including multiple electrodes (e.g., an IDT), wherein different IDTs are configured for transduction of lateral acoustic waves of different wavelengths in the different thinned regions. When multiple resonators are provided, in preferred embodiments the electrodes (e.g., IDTs) of the respective resonators are electrically isolated from one another.

FIGS. 4A-4H are cross-sectional views of portions of a multi-frequency MEMS guided wave device during various steps of fabrication according to one embodiment of the present disclosure, with the resulting device (shown in FIG. 4H) being similar to the device 10 illustrated in FIGS. 1A-1B. FIG. 4A illustrates a single crystal piezoelectric wafer 12A including first and second surfaces 60, 62. FIG. 4B illustrates the piezoelectric wafer 12A following patterning of the first surface 60 with a photoresist layer 94 defining an aperture 96 to expose a portion of the first surface 60. Such aperture 96 enables the exposed portion of the first surface 60 to receive an etchant (e.g., an acid) to enable formation of a first recess 18. FIG. 4C illustrates the piezoelectric wafer 12A following formation of the first recess 18 and removal of the photoresist layer 94 (shown in FIG. 4B). Thereafter, another photoresist layer (not shown) may be patterned over the first surface 60 to define another aperture exposing a different portion of the first surface 60, an etchant may be supplied to the first surface 60 to define a second recess 20, and the photoresist layer 94 may be removed to yield a wafer with recesses 18, 20 of different depths as illustrated in FIG. 4D. In certain embodiments, any suitable technique may be used to form the recesses 18, 20, including but not limited to ion milling and micromachining. Thereafter, the first and second recesses 18, 20 are filled with sacrificial material 64, 66 to a level along the first surface 60 of the piezoelectric wafer 12A, as shown in FIG. 4E. The first surface 60 containing regions of sacrificial material 64, 66, as well as a mating surface of a substrate 22, are then surface finished (e.g., via chemical mechanical planarization (CMP) and polishing to provide near-atomic flatness), in preparation for bonding of the piezoelectric wafer 12A (including regions of sacrificial material 64, 66) to the substrate 22. After bonding is complete, the entire piezoelectric wafer 12A is thinned and polished along the exposed second surface 62 by any suitable process steps (e.g., grinding followed by chemical and/or mechanical polishing) to yield the piezoelectric layer 12, which is bonded to the substrate 22 along a bonded interface 24 as shown in FIG. 4F. The foregoing thinning step is performed to controllably reduce the thickness of the piezoelectric layer 12 (including first and second thinned regions 14, 16 proximate to the first and second recesses 18, 20 containing regions of sacrificial material 64, 66) and to prepare the exposed surface of the piezoelectric layer 12 for deposition of metal electrodes forming the IDTs 30, 32 as shown in FIG. 4G. Following formation of the IDTs 30, 32, the sacrificial materials 64, 66 are removed from the recesses 18, 20 (e.g., by flowing one or more liquids suitable for dissolution of the sacrificial material through vertical apertures (not shown) extending through the piezoelectric layer 12) to cause the recesses 18, 20 to form unfilled cavities, as shown in FIG. 4H. The resulting structure shown in FIG. 4H embodies a multi-frequency MEMS guided wave device including first and second IDTs 30, 32 arranged over first and second thinned regions 14, 16 of different thicknesses bounding unfilled recesses 18, 20, with the piezoelectric layer 12 being bonded to a substrate 22. The IDTs 30, 32 are configured for transduction of lateral acoustic waves of different wavelengths (i.e., wavelengths $\lambda_1$ and $\lambda_2$) in the different thinned regions 14, 16.

Although the multi-frequency MEMS guided wave device illustrated in FIG. 4H includes recesses 18, 20 embodying unfilled cavities, in certain embodiments one or more recesses may be at least partially (preferably completely) filled with a fast wave propagation material to promote confinement of a laterally excited wave in the proximately arranged thinned region of a piezoelectric layer. Such confinement may significantly reduce or avoid dissipation of acoustic radiation in a substrate.

FIGS. 5A-5G are cross-sectional views of portions of a multi-frequency MEMS guided wave device during various steps of fabrication according to another embodiment of the present disclosure, with the resulting device (shown in FIG. 5G) including first and second thinned piezoelectric material regions 14, 16 of different thicknesses overlaid by IDTs 30, 32 and arranged over first and second recesses 18, 20 filled with fast wave propagation materials 68, 70. Fabrication of the device of FIG. 5G is similar to fabrication of the device of FIG. 4H, except that fast wave propagation materials 68, 70 instead of sacrificial materials 64, 66 are deposited in the recesses 18, 20 defined in the piezoelectric wafer 12A, and the fast wave propagation materials 68, 70 are not removed after formation of the IDTs 30, 32.

FIG. 5A illustrates a single crystal piezoelectric wafer 12A including first and second surfaces 60, 62. FIG. 5B illustrates the piezoelectric wafer 12A following patterning of the first surface 60 with a photoresist layer 94 defining an aperture 96 to expose a portion of the first surface 60. Such aperture 96 enables the exposed portion of the first surface 60 to receive an etchant (e.g., an acid) to enable formation of a first recess 18. FIG. 5C illustrates the piezoelectric wafer 12A following formation of the first recess 18 and removal of the photoresist layer 94 (shown in FIG. 5B). Thereafter, another photoresist layer (not shown) may be patterned over the first surface 60 to define another aperture exposing a different portion of the first surface 60, an etchant may be supplied to the first surface 60 to define a second recess 20, and the photoresist layer may be removed to yield a wafer with recesses 18, 20 of different depths as illustrated in FIG. 5D. Thereafter, the first and second recesses 18, 20 may be filled with fast wave propagation material 68, 70 to a level along the first surface 60 of the piezoelectric wafer 12A, as shown in FIG. 5E. The first surface 60 containing regions of fast wave propagation material 68, 70, as well as a mating surface of a substrate 22, are then surface finished (e.g., via chemical mechanical planarization (CMP) and polishing to provide near-atomic flatness), in preparation for bonding of the piezoelectric wafer 12A (including regions of fast wave propagation material 68, 70) to the substrate 22. After bonding is complete, the entire piezoelectric wafer 12A is thinned and polished along the exposed second surface 62 by any suitable process steps (e.g., grinding followed by chemical and/or mechanical polishing) to yield the piezoelectric layer 12, which is bonded to the substrate 22 along a bonded interface 24 as shown in FIG. 5F. The foregoing thinning step is performed to controllably reduce the thickness of the piezoelectric layer 12 (including first and second thinned regions 14, 16 proximate to the first and second recesses 18, 20 containing regions of fast wave propagation material 68, 70) and to prepare the exposed surface of the piezoelectric layer 12 for deposition of metal electrodes forming the IDTs 30, 32 as shown in FIG. 5G. The resulting structure shown in FIG. 5G embodies a multi-frequency MEMS guided wave device including first and second IDTs 30, 32 arranged over first and second thinned piezoelectric material regions 14, 16 of different thicknesses bounding recesses 18, 20 filled with regions of fast wave propagation material 68, 70, with the piezoelectric layer 12 being bonded to a substrate 22 along a bonded interface 24. The IDTs 30, 32 are configured for transduction of lateral acoustic waves of different wavelengths (i.e., wavelengths $\lambda_1$ and $\lambda_2$) in the different thinned regions 14, 16, with the regions of fast wave propagation material 68, 70 being arranged to promote confinement of the lateral acoustic waves.

In certain embodiments, one or more recesses of a MEMS guided wave device may contain at least one electrode proximate to a thinned region of a piezoelectric layer. In certain embodiments, an electrode within a recess may include a substantially continuous electrode, such as may be used in combination with an IDT arranged on an opposing surface of a thinned region of a piezoelectric layer. In certain embodiments, an electrode within a recess may be used as a floating electrode or a shorting electrode (e.g., to enable launch of asymmetric waves).

FIGS. 6A-6J are cross-sectional views of portions of a multi-frequency MEMS guided wave device during various steps of fabrication according to one embodiment of the present disclosure, with the resulting device (shown in FIG. 6J) including first and second thinned piezoelectric material regions 14, 16 of different thicknesses overlaid by IDTs 30, 32 and arranged to bound first and second recesses 18, 20, wherein an electrode 72 is provided within the second recess 20 that is otherwise unfilled, and the piezoelectric layer 12 is bonded to a substrate 22. Fabrication of the device of FIG. 6J is similar to fabrication of the device of FIG. 4H, with the addition of a step of forming an electrode 72 within the second recess 20.

FIG. 6A illustrates a single crystal piezoelectric wafer 12A including first and second surfaces 60, 62. FIG. 6B illustrates the piezoelectric wafer 12A following patterning of the first surface 60 with a photoresist layer 94 defining an aperture 96 to expose a portion of the first surface 60. Such aperture 96 enables the exposed portion of the first surface 60 to receive an etchant (e.g., an acid) to enable formation of a first recess 18. FIG. 6C illustrates the piezoelectric wafer 12A following formation of the first recess 18 and removal of the photoresist layer 94 (shown in FIG. 6B). Thereafter, another photoresist layer (not shown) may be patterned over the first surface 60 to define another aperture exposing a different portion of the first surface 60, an etchant may be supplied to the first surface 60 to define a second recess 20, and the photoresist layer may be removed to yield a wafer with recesses 18, 20 of different depths as illustrated in FIG. 6D. Following formation of the recesses 18, 20, a masking layer 69 is formed over portions of the first surface 60 and the first recess 18, with a window 71 in the masking layer 69 exposing the second recess 20, as shown in FIG. 6E. Thereafter, metal is deposited in the second recess 20 to form an electrode 72, and the masking layer 69 is removed, as shown in FIG. 6F. Following the metal deposition step, the first and second recesses 18, 20 are filled with sacrificial material 64, 66 to a level along the first surface 60 of the piezoelectric wafer 12A, as shown in FIG. 6G. The first surface 60 containing regions of sacrificial material 64, 66, as well as a mating surface of a substrate 22, are then surface finished (e.g., via chemical mechanical planarization (CMP) and polishing to provide near-atomic flatness), in preparation for bonding of the piezoelectric wafer 12A (including regions of sacrificial material 64, 66) to a substrate 22. After bonding is complete, the entire piezoelectric wafer 12A is thinned and polished along the exposed second surface 62 by any suitable process steps (e.g., grinding followed by chemical and/or mechanical polishing) to yield the piezoelectric layer 12, which is bonded to the substrate 22 along a bonded interface 24 as shown in FIG. 6H. The foregoing thinning step is performed to controllably reduce the thickness of the piezoelectric layer 12 (including first and second thinned regions 14, 16 proximate to the first and second recesses 18, 20 containing regions of sacrificial material 64, 66) and to prepare the exposed surface of the piezoelectric layer 12 for deposition of metal electrodes forming the IDTs 30, 32 as shown in FIG. 6I. Following formation of the IDTs 30, 32, the sacrificial materials 64, 66 are removed from the recesses 18, 20 (e.g., by flowing one or more liquids suitable for dissolution of the sacrificial material through vertical apertures (not shown) extending through the piezoelectric layer 12) to cause the recesses 18, 20 to form unfilled cavities, as shown in FIG. 6J. The resulting structure shown in FIG. 6J embodies a multi-frequency MEMS guided wave device including first and second IDTs 30, 32 arranged over first and second thinned piezoelectric material regions 14, 16 of different thicknesses bounding unfilled recesses 18, 20, with the second recess containing an electrode 72, and with the piezoelectric layer 12 being bonded to a substrate 22. The first IDT 30, and the second IDT 32 in combination with the electrode 72, are configured for transduction of acoustic waves of different wavelengths (i.e., wavelengths $\lambda_1$ and $\lambda_2$) in the different thinned regions 14, 16. Although FIG. 6J illustrates an electrode 72 formed only in the second recess 20, it is to be appreciated that electrodes may be formed in either or both recesses 18, 20 in certain embodiments.

Although the multi-frequency MEMS guided wave device illustrated in FIG. 6J includes at least one electrode 72 in conjunction with recesses 18, 20 embodying unfilled cavities, in certain embodiments one or more electrodes may be provided in recesses that may be filled with one or more fast wave propagation materials to promote confinement of a laterally excited wave in the proximately arranged thinned region of a piezoelectric layer. Such confinement may significantly reduce or avoid dissipation of acoustic radiation in a substrate.

FIGS. 7A-7I are cross-sectional views of portions of a multi-frequency MEMS guided wave device during various steps of fabrication according to one embodiment of the present disclosure, with the resulting device (shown in FIG. 7I) including first and second thinned piezoelectric material regions 14, 16 of different thicknesses overlaid by IDTs 30, 32 and arranged to bound first and second recesses 18, 20 filled with fast wave propagation material 68, 70, wherein an electrode 72 is provided within the second recess 20, and the piezoelectric layer 12 is bonded to a substrate 22. Fabrication of the device of FIG. 7I is similar to fabrication of the device of FIG. 5G, with the addition of a step of forming an electrode 72 within the second recess 20.

FIG. 7A illustrates a single crystal piezoelectric wafer 12A including first and second surfaces 60, 62. FIG. 7B illustrates the piezoelectric wafer 12A following patterning of the first surface 60 with a photoresist layer 94 defining an aperture 96 to expose a portion of the first surface 60. Such aperture 96 enables the exposed portion of the first surface 60 to receive an etchant (e.g., an acid) to enable formation of a first recess 18. FIG. 7C illustrates the piezoelectric wafer 12A following formation of the first recess 18 and removal of the photoresist layer 94 (shown in FIG. 7B). Thereafter, another photoresist layer (not shown) may be patterned over the first surface 60 to define another aperture exposing a different portion of the first surface 60, an etchant may be supplied to the first surface 60 to define a second recess 20, and the photoresist layer may be removed to yield a wafer with recesses 18, 20 of different depths as illustrated in FIG. 7D. Following formation of the recesses 18, 20, a masking layer 69 is formed over portions of the first surface 60 and the first recess 18, with a window 71 in the masking layer 69 exposing the second recess 20, as shown in FIG. 7E. Thereafter, metal is deposited in the second recess 20 to form an electrode 72, and the masking layer 69 is removed, as shown in FIG. 7F. Following the metal deposition step, the first and second recesses 18, 20 are filled with fast wave propagation material 68, 70 to a level along the first surface 60 of the piezoelectric wafer 12A, as shown in FIG. 7G. The first surface 60 containing regions of fast wave propagation material 68, 70, as well as a mating surface of a substrate 22, are then surface finished (e.g., via chemical mechanical planarization (CMP) and polishing to provide near-atomic flatness), in preparation for bonding of the piezoelectric wafer 12A (including regions of fast wave propagation material 68, 70) to a substrate 22. After bonding is complete, the entire piezoelectric wafer 12A is thinned and polished along the exposed second surface 62 by any suitable process steps (e.g., grinding followed by chemical and/or mechanical polishing) to yield the piezoelectric layer 12, which is bonded to the substrate 22 along a bonded interface 24 as shown in FIG. 7H. Thereafter, metal electrodes are deposited on the exposed surface of the piezoelectric layer 12 to form IDTs 30, 32, as shown in FIG. 7I. The resulting structure shown in FIG. 7I embodies a multi-frequency MEMS guided wave device including first and second IDTs 30, 32 arranged over first and second thinned piezoelectric material regions 14, 16 of different thicknesses bounding recesses 18, 20 filled with fast wave propagation material 68, 70 (or alternatively filled with a slow wave propagation material), with the second recess 20 containing an electrode 72, and with the piezoelectric layer 12 being bonded to a substrate 22. The first IDT 30, and the second IDT 32 in combination with the electrode 72, are configured for transduction of acoustic waves of different wavelengths (i.e., wavelengths $\lambda_1$ and $\lambda_2$) in the different thinned regions 14, 16 of the piezoelectric layer 12, and each region of fast wave propagation material 68, 70 is arranged to promote confinement of a laterally excited wave in the proximately arranged thinned region 14, 16 of the piezoelectric layer 12. Although FIG. 7I illustrates an electrode 72 formed only in the second recess 20, it is to be appreciated that electrodes may be formed in either or both recesses 18, 20 in certain embodiments.

In certain embodiments, a continuous buffer layer may be intermediately arranged between a recess-defining piezoelectric layer and a substrate. A buffer layer may facilitate bonding with the respective adjacent layers, and/or prevent chemical interaction with the substrate during removal of sacrificial material from recesses defined in the piezoelectric layer. If a buffer layer is provided, then the recesses defined in the piezoelectric layer may be bounded laterally and from above by piezoelectric material, and bounded below by buffer layer material. A buffer layer may be added to any of the embodiments previously disclosed herein.

FIGS. 8A-8I are cross-sectional views of portions of a multi-frequency MEMS guided wave device during various steps of fabrication according to one embodiment of the present disclosure, with the resulting device (shown in FIG. 8I) including first and second thinned piezoelectric material regions of different thicknesses overlaid by IDTs and arranged above first and second unfilled recesses, and a buffer layer being arranged between the piezoelectric layer and a substrate.

FIG. 8A illustrates a single crystal piezoelectric wafer 12A including first and second surfaces 60, 62. FIG. 8B illustrates the piezoelectric wafer 12A following patterning of the first surface 60 with a photoresist layer 94 defining an aperture 96 to expose a portion of the first surface 60. Such aperture 96 enables the exposed portion of the first surface 60 to receive an etchant (e.g., an acid) to enable formation of a first recess 18. FIG. 8C illustrates the piezoelectric wafer 12A following formation of the first recess 18 and removal of the photoresist layer 94 (shown in FIG. 8B). Thereafter, another photoresist layer (not shown) may be patterned over the first surface 60 to define another aperture exposing a different portion of the first surface 60, an etchant may be supplied to the first surface 60 to define a second recess 20, and the photoresist layer may be removed to yield a wafer 12A with recesses 18, 20 of different depths as illustrated in FIG. 8D. Thereafter, the first and second recesses 18, 20 are filled with sacrificial material 64, 66 to a level along the first surface 60 of the piezoelectric wafer 12A, as shown in FIG. 8E. The first surface 60 containing regions of sacrificial material 64, 66, is then surface finished (e.g., via chemical mechanical planarization (CMP) and polishing to provide near-atomic flatness), followed by deposition of a buffer layer 74 over the finished first surface 60 of the piezoelectric wafer 12A (including regions of sacrificial material 64, 66), as shown in FIG. 8F. (Alternatively, in certain embodiments, the buffer layer 74 may be deposited over a substrate.) Then, an exposed outer surface of the buffer layer 74, as well as a mating surface of a substrate 22, are surface finished and directly bonded. Thereafter, the piezoelectric wafer 12A is thinned and planarized along the exposed second surface 62 by any suitable process steps (e.g., grinding followed by chemical mechanical planarization and polishing) to yield a piezoelectric layer 12 bonded over a substrate 22 with a buffer layer 74 arranged therebetween, wherein a bonded interface 24 is provided between the substrate 22 and the piezoelectric layer 12 along one surface of the buffer layer 74, as shown in FIG. 8G. The foregoing thinning step is performed to controllably reduce the thickness of the piezoelectric layer 12 (including first and second thinned regions 14, 16 proximate to the first and second recesses 18, 20 containing regions of sacrificial material 64, 66) and to prepare the exposed surface of the piezoelectric layer 12 for deposition of metal electrodes forming the IDTs 30, 32 as shown in FIG. 8H. Following formation of the IDTs 30, 32, the sacrificial materials 64, 66 are removed from the recesses 18, 20 (e.g., by flowing one or more liquids suitable for dissolution of the sacrificial material through vertical apertures (not shown) extending through the piezoelectric layer 12) to cause the recesses 18, 20 to form unfilled cavities, as shown in FIG. 8I. The resulting structure shown in FIG. 8I embodies a multi-frequency MEMS guided wave device including first and second IDTs 30, 32 arranged over first and second thinned piezoelectric material regions 14, 16 of different thicknesses bounding unfilled recesses 18, 20, with the piezoelectric layer 12 and substrate 22 being bonded through an intermediately arranged buffer layer 74. The IDTs 30, 32 are configured for transduction of lateral acoustic waves of different wavelengths (i.e., wavelengths $\lambda_1$ and $\lambda_2$) in the different thinned regions 14, 16 of the piezoelectric layer 12.

In certain embodiments, a multi-frequency MEMS guided wave device may include recesses defined in a substrate, wherein the recesses defined in the substrate are substantially registered with unfilled recesses defined below the first and second thinned regions of the piezoelectric layer. Such a configuration may aid removal of sacrificial material from below thinned regions of a piezoelectric layer, thereby enabling formation of features and geometries that would be difficult to achieve in a reproducible way using prior methods relying upon ion implantation to create a damaged internal release layer of piezoelectric material.

FIG. 9A illustrates a substrate 22 defining first and second recesses 78, 80 containing sacrificial material 98. Such recesses 78, 80 may be formed by photolithographic etching (similar to the steps described previously herein for forming recesses in a piezoelectric layer), subsequently filled with sacrificial material 98, and then surface finished in preparation for direct bonding.

FIG. 9B illustrates a multi-frequency MEMS guided wave device similar to the device of FIG. 4H, but including the substrate of FIG. 9A defining recesses 78, 80 (following removal of the sacrificial material), wherein the recesses 78, 80 defined in the substrate 22 are substantially registered with unfilled recesses 18, 20 defined below first and second thinned regions 14, 16 of the piezoelectric layer 12, such that recesses 18, 78 are continuous with one another, and recesses 20, 80 are continuous with one another. A first surface 60 of the piezoelectric layer 12 is directly bonded to the substrate 22 along a bonded interface 24. First and second IDTs 30, 32 are arranged over the first and second thinned piezoelectric material regions 14, 16 of different thicknesses, such that the recesses 18, 20 are bounded from above by the thinned regions 14, 16, of the piezoelectric layer, and bounded from below by the substrate 22. The IDTs 30, 32 are configured for transduction of lateral acoustic waves of different wavelengths in the different thinned regions 14, 16.

FIG. 9C illustrates a multi-frequency MEMS guided wave device similar to the device of FIG. 9B, with addition of an electrode 72 within the second recess 20. The device of FIG. 9C includes first and second IDTs 30, 32 arranged over first and second thinned piezoelectric material regions 14, 16 of different thicknesses bounding recesses 18, 20, with one surface 60 of the piezoelectric layer 12 being bonded to a substrate 22 along a bonded interface 24. Unfilled recesses 18, 20 are defined below first and second thinned regions 14, 16 of the piezoelectric layer 12, such that recesses 18, 78 are continuous with one another, and recesses 20, 80 are continuous with one another. The IDTs 30, 32 are configured for transduction of lateral acoustic waves of different wavelengths (i.e., wavelengths $\lambda_1$ and $\lambda_2$) in the different thinned regions 14, 16. Although FIG. 9C illustrates an electrode 72 formed only in the second recess 20, it is to be appreciated that electrodes may be formed in either or both recesses 18, 20 in certain embodiments.

Although FIGS. 9B and 9C illustrate the recesses 18, 20, 78, and 80 as unfilled cavities, in certain embodiments, one, some, or all of the recesses 18, 20, 78, or 80 may be partially or completely filled with a material such as a fast wave propagation material or a slow wave propagation material.

In certain embodiments, a field layer is intermediately arranged between the piezoelectric layer and the substrate layer, wherein the field layer defines a first field layer aperture substantially registered with the first recess and defines a second field layer aperture substantially registered with the second recess. Such a configuration may aid removal of sacrificial material from below thinned regions of a piezoelectric layer, thereby enabling formation of features and geometries that would be difficult to achieve in a reproducible way using prior methods relying upon ion implantation to create a damaged internal release layer of piezoelectric material.

FIG. 10A is a cross-sectional view of a substrate 22 overlaid with a composite layer including a field layer material 82 as well as first and second sacrificial layer regions 88, 90 provided in apertures 84, 86 defined in the field layer material 82. In certain embodiments, the field layer material 82 may be deposited on a surface of the substrate 22, followed by definition of apertures 84, 86 by photolithography, followed by deposition of sacrificial layer regions 88, 90 in the apertures 84, 86. The substrate 22 and composite layer shown in FIG. 10A are suitable for use in fabricating multi-frequency MEMS guided wave devices according to FIGS. 10B and 10C.

FIG. 10B illustrates a multi-frequency MEMS guided wave device similar to the device of FIG. 4H, but including the substrate 22 of FIG. 10A following removal of the sacrificial material 88, 90 to yield unfilled apertures 84, 86 in the field layer material 82, wherein the apertures 84, 86 defined in the field layer material 82 are substantially registered with unfilled recesses 18, 20 defined below the first and second thinned regions 14, 16 of the piezoelectric layer 12. In such a configuration, recesses 18, 20 are continuous with the apertures 84, 86, respectively, such that the recesses 18, 20 are bounded from above by the piezoelectric layer 12, bounded laterally by the piezoelectric layer 12 and the apertures 84, 86, and bounded from below by the substrate 22. A bonded interface 24 is provided between the piezoelectric layer 12 and the substrate 22 proximate to the field layer 82, which is intermediately arranged between the piezoelectric layer 12 and the substrate 22. The resulting structure shown in FIG. 10B embodies a multi-frequency MEMS guided wave device including first and second IDTs 30, 32 arranged over first and second thinned piezoelectric material regions 14, 16 of different thicknesses bounding unfilled recesses 18, 20. The IDTs 30, 32 are configured for transduction of lateral acoustic waves of different wavelengths in the different thinned regions 14, 16.

FIG. 10C illustrates a multi-frequency MEMS guided wave device similar to the device of FIG. 10B, with addition of an electrode 72 within the second recess 20. The device of FIG. 10C includes first and second IDTs 30, 32 arranged over first and second thinned piezoelectric material regions 14, 16 arranged over recesses 18, 20. The recesses 18, 20 are continuous with apertures 84, 86, respectively, such that the recesses 18, 20 are bounded from above by the piezoelectric layer 12, bounded laterally by the piezoelectric layer 12 and the apertures 84, 86, and bounded from below by the substrate 22. A bonded interface 24 is provided between the piezoelectric layer 12 and the substrate 22 proximate to the field layer 82, which is intermediately arranged between the piezoelectric layer 12 and the substrate 22. The first IDT 30, and the second IDT 32 in combination with the electrode 72, are configured for transduction of acoustic waves of different wavelengths (i.e., wavelengths $\lambda_1$ and $\lambda_2$) in the different thinned regions 14, 16. Although FIG. 10C illustrates an electrode 72 formed only in the second recess 20, it is to be appreciated that electrodes may be formed in either or both recesses 18, 20 in certain embodiments.

Although FIGS. 10B and 10C illustrate the recesses 18, 20 and the apertures 84, 86 as unfilled cavities, in certain embodiments, one, some, or all of the recesses 18, 20 and/or the apertures 84, 86 may be partially or completely filled with a material such as a fast wave propagation material or a slow wave propagation material.

Upon reading the following description in light of the accompanying drawing figures, those skilled in the art will understand the concepts of the disclosure and will recognize applications of these concepts not particularly addressed herein. Those skilled in the art will recognize improvements and modifications to the preferred embodiments of the present disclosure. All such improvements and modifications are considered within the scope of the concepts disclosed herein and the claims that follow. Any of the various features and elements as disclosed herein may be combined with one or more other disclosed features and elements unless indicated to the contrary herein.

What is claimed is:

1. A method of fabricating a micro-electrical-mechanical system (MEMS) guided wave device, the method comprising:
locally thinning a piezoelectric layer to define a first recess and a second recess in the piezoelectric layer, wherein the first recess is bounded by a first thinned region of the piezoelectric layer comprising a first thickness, the second recess is bounded by a second thinned region of the piezoelectric layer comprising a second thickness, and the second thickness differs from the first thickness;
bonding the piezoelectric layer on or over a substrate layer, to form at least one bonded interface between the piezoelectric layer and the substrate layer;
defining a first plurality of electrodes arranged on or adjacent to the first thinned region and configured for transduction of a lateral acoustic wave having a wavelength $\lambda_1$ in the first thinned region; and
defining a second plurality of electrodes arranged on or adjacent to the second thinned region and configured for transduction of a lateral acoustic wave having a wavelength $\lambda_2$ in the second thinned region.

2. The method of claim 1, wherein the local thinning of the piezoelectric layer to define the first recess and the second recess in the piezoelectric layer comprises etching the piezoelectric layer.

3. The method of claim 1, further comprising:
depositing a sacrificial material in the first recess and the second recess prior to the bonding;
planarizing at least one surface of the piezoelectric layer after the depositing of the sacrificial material; and
removing the sacrificial material from the first recess and the second recess after the bonding of the piezoelectric layer on or over the substrate layer.

4. The method of claim 3, further comprising:
defining a first substrate recess and a second substrate recess in the substrate layer prior to the bonding of the piezoelectric layer on or over the substrate layer;
planarizing at least one surface of the substrate layer after deposition of the sacrificial material; and
positioning the piezoelectric layer and the substrate layer relative to one another to substantially register the first substrate recess with the first recess, and to substantially register the second substrate recess with the second recess, prior to the bonding.

5. The method of claim 1, further comprising:
filling at least one of the first recess or the second recess with a fast wave propagation material prior to the bonding of the piezoelectric layer on or over the substrate layer; and
prior to the bonding of the piezoelectric layer on or over the substrate layer, planarizing at least one surface of the piezoelectric layer after filling of at least one of the first recess or the second recess.

6. The method of claim 1, further comprising thinning and polishing at least one surface of the piezoelectric layer after the bonding of the piezoelectric layer on or over the substrate layer.

7. The method of claim 1, comprising at least one of the following features (i) or (ii):

(i) the defining of the first plurality of electrodes includes defining at least one electrode within the first recess; and (ii) the defining of the second plurality of electrodes includes defining at least one electrode within the second recess.

8. The method of claim 1, wherein the bonding of the piezoelectric layer on or over the substrate layer comprises bonding the substrate layer to the piezoelectric layer to cause the first recess and the second recess to be bounded in part by the substrate layer.

9. The method of claim 1, further comprising depositing a buffer layer on one of the piezoelectric layer or the substrate layer, wherein the bonding of the piezoelectric layer on or over the substrate layer comprises bonding the other of the piezoelectric layer or the substrate layer to the buffer layer, to cause the first recess and the second recess to be bounded in part by the buffer layer.

10. The method of claim 1, further comprising:
depositing sacrificial material in the first recess and the second recess;
forming a composite layer including field layer regions and including first and second sacrificial material regions over the substrate layer;
planarizing at least one surface of the piezoelectric layer and at least one surface of the substrate layer; and
prior to the bonding, aligning the substrate layer and the piezoelectric layer relative to one another to substantially register the first sacrificial material region with the sacrificial material deposited in the first recess, and to substantially register the second sacrificial material region with the sacrificial material deposited in the second recess;
wherein the bonding of the piezoelectric layer on or over the substrate layer comprises bonding the piezoelectric layer to the field layer regions.

11. The method of claim 1, wherein the piezoelectric layer comprises lithium tantalate or lithium niobate.

12. The method of claim 1, wherein the piezoelectric layer comprises quartz, aluminum nitride, zinc oxide, or a piezoceramic material.

13. The method of claim 1, wherein the wavelength $\lambda_1$ is about 900 MHz and the wavelength $\lambda_2$ is about 1800 MHz.

14. The method of claim 1, wherein the wavelength $\lambda_1$ is about 900 MHz, and the wavelength $\lambda_2$ is about 2.4 GHz.

15. The method of claim 1, wherein the first plurality of electrodes comprises a first interdigital transducer, and the second plurality of electrodes comprises a second interdigital transducer.

16. The MEMS guided wave device produced by the method of claim 1.

* * * * *